(12) United States Patent
Ueda

(10) Patent No.: US 8,034,707 B2
(45) Date of Patent: Oct. 11, 2011

(54) METHOD FOR FABRICATING SEMICONDUCTOR DEVICE AND SEMICONDUCTOR DEVICE

(75) Inventor: Tetsuya Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/897,416

(22) Filed: Oct. 4, 2010

(65) Prior Publication Data

US 2011/0021017 A1 Jan. 27, 2011

Related U.S. Application Data

(62) Division of application No. 12/786,156, filed on May 24, 2010, now Pat. No. 7,830,014, which is a division of application No. 12/603,197, filed on Oct. 21, 2009, now Pat. No. 7,749,891, which is a division of application No. 12/277,933, filed on Nov. 25, 2008, now Pat. No. 7,622,807, which is a division of application No. 11/253,568, filed on Oct. 20, 2005, now Pat. No. 7,473,632.

(30) Foreign Application Priority Data

Oct. 25, 2004 (JP) ................................ 2004-309579

(51) Int. Cl.
*H01L 21/4763* (2006.01)
(52) U.S. Cl. ........................................ 438/622; 438/618
(58) Field of Classification Search .................. 438/618, 438/622

See application file for complete search history.

(56) References Cited

U.S. PATENT DOCUMENTS

| | | | |
|---|---|---|---|
| 5,861,674 A | 1/1999 | Ishikawa | |
| 6,054,381 A | 4/2000 | Okada | |
| 6,239,016 B1 | 5/2001 | Ishikawa | |
| 6,451,669 B2 | 9/2002 | Torres et al. | |
| 6,509,623 B2 | 1/2003 | Zhao | |
| 6,524,948 B2 * | 2/2003 | Tamaoka et al. | 438/637 |
| 6,545,361 B2 | 4/2003 | Ueda et al. | |

(Continued)

FOREIGN PATENT DOCUMENTS

JP 09-027546 1/1997

(Continued)

OTHER PUBLICATIONS

Arnal et al.; "A Novel SiO2-Air Gap Low K for Copper Dual Damascene Interconnect"; Advanced Metallization; c. 2000; pp. 71-76.

(Continued)

*Primary Examiner* — Bradley K Smith
(74) *Attorney, Agent, or Firm* — McDermott Will & Emery LLP

(57) ABSTRACT

A method for fabricating a semiconductor device includes the steps of forming a plurality of lower interconnections at intervals in a first insulating film; removing a portion of the first insulating film located between the lower interconnections, thereby forming an interconnection-to-interconnection gap; forming a second insulating film over the first insulating film in which the lower interconnections and the interconnection-to-interconnection gap are formed such that an air gap is formed out of the interconnection-to-interconnection gap; and forming, in the second insulating film, a connection portion connected to one of the lower interconnections and an upper interconnection connected to the connection portion. The connection portion is formed to be connected to one of the lower interconnections not adjacent to the air gap.

13 Claims, 14 Drawing Sheets

U.S. PATENT DOCUMENTS

| | | |
|---|---|---|
| 6,887,766 B2 | 5/2005 | Koh |
| 7,041,571 B2 * | 5/2006 | Strane .......................... 438/411 |
| 7,449,407 B2 | 11/2008 | Lur et al. |
| 2003/0183940 A1 | 10/2003 | Noguchi et al. |
| 2009/0280642 A1 | 11/2009 | Shimooka et al. |
| 2009/0302473 A1 | 12/2009 | Shibata et al. |

FOREIGN PATENT DOCUMENTS

| | | |
|---|---|---|
| JP | 09-055431 | 2/1997 |
| JP | 10-233448 | 9/1998 |
| JP | 2000-091426 | 3/2000 |
| JP | 2001-053144 | 2/2001 |
| JP | 2001-284355 | 10/2001 |
| JP | 2003-068851 | 3/2003 |

OTHER PUBLICATIONS

Japanese Office Action, with English Translation, issued in corresponding Japanese Patent Application No. JP 2004-309579, mailed on Dec. 18, 2007.

Notice of Allowance issued in U.S. Appl. No. 12/786,156, dated Jul. 2, 2010.

Japanese Notice of Reasons for Rejection, with English Translation, issued in Japanese Patent Application No. 2008-032950, mailed Feb. 1, 2011.

* cited by examiner

METHOD FOR FABRICATING SEMICONDUCTOR DEVICE AND SEMICONDUCTOR DEVICE

CROSS-REFERENCE TO RELATED APPLICATIONS

This application is a Divisional of U.S. application Ser. No. 12/786,156, filed on May 24, 2010 now U.S. Pat. No. 7,830,014, which is a Divisional of U.S. application Ser. No. 12/603,197, filed on Oct. 21, 2009, now U.S. Pat. No. 7,749,891, which is a Divisional of U.S. application Ser. No. 12/277,933, filed on Nov. 25, 2008, now U.S. Pat. No. 7,622,807, which is a Divisional of U.S. application Ser. No. 11/253,568, filed on Oct. 20, 2005, now U.S. Pat. No. 7,473,632, claiming priority of Japanese Patent Application No. 2004-309579, filed on Oct. 25, 2004, the entire contents of each of which are hereby incorporated by reference.

BACKGROUND OF THE INVENTION

The present invention relates to methods for fabricating semiconductor devices including multilayer interconnection and semiconductor devices fabricated by the fabrication methods.

Recent remarkable progress of semiconductor processing technology has enabled significant size reduction and high integration of interconnection or devices, so that the performance of ULSI has been enhanced. With increased integration degree of interconnection, signal delay in the interconnection has come to determine operation speed of devices. In ULSI in 0.25-μm generation or later generation, attempts to use materials having low dielectric constants, SiOC containing organic substances or organic materials for interlayer insulating films have been made to date. However, these materials have drawbacks in hygroscopicity or heat resistance, and thus it is difficult to establish processes using these materials.

To reduce a delay between interconnections, which is a delay having an especially large influence, a technique for reducing the relative dielectric constant between the interconnections by intentionally providing voids (hereinafter, referred to as air gaps) formed by air ($\in=1.0$) between interconnections in an insulating material has been proposed. As a method for forming air gaps in a copper interconnect structure, a method in which an insulating film existing between buried interconnections is removed by etching and then another insulating film is deposited is proposed (see, for example, "A Novel SiO$_2$-Air Gap low-k Copper Dual Damascene Interconnect" T Micro electronics V. Arnal et. al., p. 71, 2000 Advance Metallization).

Hereinafter, a method for forming air gaps in a copper interconnect structure will be described with reference to FIGS. 11A through 11D and FIGS. 12A through 12C. FIGS. 11A through 11D and FIGS. 12A through 12C are cross-sectional views of main portions showing a method for forming air gaps in a copper interconnect structure.

First, as shown in FIG. 11A, a first insulating film 10 is deposited over a semiconductor substrate (not shown) on which a semiconductor active device is formed, and then recesses are formed in the first insulating film 10. Subsequently, first barrier metal films 11 are formed on the bottoms and walls of the recesses in the first insulating film 10, and then first interconnections 12 made of copper films are formed so that the recesses are filled therewith.

Next, as shown in FIG. 11B, to prevent peeling of the first interconnections 12 and diffusion of copper forming the first interconnections 12, a liner insulating film 13 is deposited over the first insulating film 10 and the first interconnections 12.

Then, as shown in FIG. 11C, a resist pattern 14 is formed on the liner insulating film 13 by lithography. The resist pattern 14 has an opening pattern with which only portions of the first insulating film 10 located between the first interconnections 12 are removed. The resist pattern 14 is used to form interconnection-to-interconnection gaps between selected ones of the first interconnections 12 and serves as a mask for exposing only regions between the selected first interconnections 12.

Thereafter, as shown in FIG. 11D, dry etching is performed using the resist pattern 14 as a mask to etch the liner insulating film 13 and the first insulating film 10, thereby forming interconnection-to-interconnection gaps 15 between the first interconnections 12.

Subsequently, as shown in FIG. 12A, a second insulating film 17 is deposited over the interconnection-to-interconnection gaps 15 between the first interconnections 12 and the liner insulating film 13, thereby forming, between the first interconnections 12, air gaps 16 whose tops project above the liner insulating film 13. The use of a film having a low coverage rate and poor burying performance as the second insulating film 17 eases formation of the air gaps 16.

Then, as shown in FIG. 12B, etching is performed so that in the second insulating film 17, a connecting hole 17a in which the surface of one of the first interconnections 12 is exposed is formed and then a interconnect trench 17b is formed. In this case, a dual damascene process in which the connecting hole 17a is formed before the interconnect trench 17b is used.

Thereafter, as shown in FIG. 12C, a barrier metal film, a seed film and a plating film are deposited in this order over the second insulating film 17 including the connecting hole 17a and the interconnect trench 17b, and then excessive portions of the barrier metal film, the seed film and the plating film extending off the connecting hole 17a and the interconnect trench 17b are removed by metal-based CMP, thereby forming a via 18 and second interconnections 19. In this manner, a double-layer interconnect structure made of the first interconnection 12 and the second interconnection 19 is formed.

With the foregoing process steps, a semiconductor device including a multilayer interconnect structure in which the air gaps 16 are formed between the first interconnections 12 made of copper films is fabricated. The relative dielectric constant of the air gaps 16 made of air is about ¼ of that of the first insulating film 10. The air gaps 16 reduce the capacitance between adjacent ones of first interconnections 12. Accordingly, a signal delay between the adjacent first interconnections 12 is suppressed, thus implementing a semiconductor device in which an operation margin is large and malfunction is less likely to occur. In addition, conventional interconnection materials can be used, so that cost reduction is achieved.

SUMMARY OF THE INVENTION

However, it was found that the method for forming air gaps described above has the following drawbacks.

First, a problem arises when the resist pattern 14 (see, FIG. 11C) becomes misaligned with the first interconnections 12. Specifically, if etching is performed using the misaligned resist pattern 14, interconnection-to-interconnection gaps 15a formed between the first interconnections 12 are smaller than the interconnection-to-interconnection gaps 15 illustrated in FIG. 11D by the degree corresponding to the misalignment, as shown in FIG. 13A, for example. In addition to the smaller shape of the gaps between the first interconnections 12 as described above, a portion of the liner insulating film 13 located on the first interconnections 12 is partly removed, so that a portion 12a of the first interconnections 12 is exposed. In this case, during formation of the interconnection-to-interconnection gaps 15a between the first interconnections 12 by etching, the portion 12a of the surface of the first interconnections 12 made of copper films is oxidized or damaged, for example, resulting in deterioration of the reliability of the first interconnections 12.

Another problem arises when misalignment occurs in photolithography performed on a structure in which one of the first interconnection 12 and the connecting hole 17a are borderless, i.e., the width of the first interconnection 12 is equal to the diameter of the connecting hole 17a. Specifically, as shown in FIG. 13B, if misalignment occurs to cause a shift of the connecting hole 17a in photolithography, the connecting hole 17a becomes continuous with one of the air gaps 16, i.e., penetrates the air gap 16 during formation of the connecting hole 17a. In this case, it is difficult to completely fill the connecting hole 17a with an interconnection material in a subsequent process step.

It is therefore an object of the present invention to provide a method for fabricating a semiconductor device in which interconnection is not damaged and an air gap and a connecting hole do not become continuous at the occurrence of misalignment, and also provides a semiconductor device fabricated by this fabrication method.

A method for fabricating a semiconductor device according to a first aspect of the present invention includes the steps of: forming a plurality of lower interconnections at intervals in a first insulating film; removing a portion of the first insulating film located between the lower interconnections, thereby forming an interconnection-to-interconnection gap; forming a second insulating film over the first insulating film in which the lower interconnections and the interconnection-to-interconnection gap are formed such that an air gap is formed out of the interconnection-to-interconnection gap; and forming, in the second insulating film, a connection portion connected to one of the lower interconnections and an upper interconnection connected to the connection portion, wherein the connection portion is formed to be connected to one of the lower interconnections not adjacent to the air gap.

In the method according to the first aspect, the connection portion is formed to be connected to one of the lower interconnections not adjacent to the air gap, so that it is possible to prevent penetration of a connecting hole through the air gap during formation of the connecting hole even at the occurrence of misalignment. In this manner, a semiconductor device including a highly-reliable multilayer interconnect structure in which interconnection-to-interconnection capacitance is reduced by forming the air gap between the lower interconnections and occurrence of failures in the connecting hole is prevented is implemented.

The method according to the first aspect preferably further includes the step of selectively forming a cap layer on each of the surfaces of the lower interconnections, after the step of forming the lower interconnections and before the step of forming the interconnection-to-interconnection gap.

Then, each of the lower interconnections is covered with the cap layer, so that exposure of the lower interconnections is prevented during formation of the interconnection-to-interconnection gap or the connecting hole even at the occurrence of misalignment. Accordingly, the lower interconnections are not damaged, thus implementing a highly-reliable interconnect structure. In addition, since the cap layer is formed on each of the lower interconnections, a material having small capacitance is freely selected as a material for an insulating film deposited thereon.

In the method according to the first aspect, the surfaces of the lower interconnections are preferably lower than the surface of the first insulating film.

Then, the cap layer is easily formed only on the surfaces of the lower interconnections whose exposure should be prevented.

In the method according to the first aspect, an interconnection-to-interconnection space X between the lower interconnections sandwiching the air gap preferably satisfies the following relationship:

$$S \leq X < 3S$$

where S is a minimum interconnection-to-interconnection space between the lower interconnections formed at a minimum resolution of lithography.

The provision of the upper limit (3S) of the interconnection-to-interconnection space described above enables suppression of decrease of interconnection-to-interconnection capacitance. In addition, formation of the air gap becomes easy, so that an additional step for forming the air gap is not needed, thus reducing the throughput.

In the method according to the first aspect, the air gap is preferably located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

Then, even when misalignment occurs, it is possible to prevent an air gap from being formed at both sides of the lower interconnection connected to the connection portion. This prevents occurrence of failures in the connecting hole.

Preferably, in the method according to the first aspect, the interconnection-to-interconnection gap is formed using a resist pattern as a mask, and the resist pattern has an opening pattern for exposing a region which is located between the lower interconnections and in which the interconnection-to-interconnection gap is to be formed and a region expanded from that region toward the lower interconnections sandwiching the region by a distance z satisfying the following relationship:

$$z = L/2$$

where L is the minimum interconnection width of the lower interconnections formed at the minimum resolution of lithography.

Then, since the resist pattern has the opening pattern for exposing a region between the lower interconnections where an interconnection-to-interconnection gap is to be formed, an opening region does not become small and an interconnection-to-interconnection gap having a sufficient opening is formed even when misalignment occurs.

The method according to the first aspect preferably further includes the step of planarizing the surface of the second insulating film by CMP after the step of forming the second insulating film and before the step of forming the upper interconnection and the connection portion.

A method for fabricating a semiconductor device according to a second aspect of the present invention includes the steps of: forming a plurality of lower interconnections at intervals in a first insulating film; removing a portion of the first insulating film located between the lower interconnections, thereby forming an interconnection-to-interconnection gap; burying a low-dielectric-constant film in the interconnection-to-interconnection gap; forming a second insulating film over the first insulating film in which the lower interconnections and the low-dielectric-constant film are buried; and forming, in the second insulating film, a connection portion connected to one of the lower interconnections and an upper interconnection connected to the connection portion, wherein the connection portion is formed to be connected to one of the lower interconnections not adjacent to the low-dielectric-constant film.

With the method according to the second aspect, the connection portion is formed to be connected to one of the lower interconnections not adjacent to the low-dielectric-constant film, so that the low-dielectric-constant film is not exposed during formation of the connecting hole even at the occurrence of misalignment. Accordingly, opening failures (via resist poisoning) such as contamination inside the connecting hole do not occur. As compared to the method according to the first aspect, though the interconnection-to-interconnection capacitance increases, a level difference is less likely to be formed in the surface of the second insulating film because the low-dielectric-constant film is buried in the interconnection-to-interconnection gap. Accordingly, the process step of planarizing the level difference can be omitted. Therefore, with the method according to the second aspect, it is possible to use a low-κ material, whose application to a conventional semiconductor fabrication process has been difficult because planarization is difficult because of its properties, for example. In this manner, a semiconductor device including a highly-reliable multilayer interconnect structure in which occurrence of failures in the connecting hole is prevented is implemented.

The method according to the second aspect preferably further includes the step of selectively forming a cap layer on each of the surfaces of the lower interconnections, after the step of forming the lower interconnections and before the step of forming the interconnection-to-interconnection gap.

Then, each of the lower interconnections is covered with the cap layer, so that exposure of the lower interconnections is prevented during formation of the interconnection-to-interconnection gap or the connecting hole even at the occurrence of misalignment. Accordingly, the lower interconnections are not damaged, thus implementing a highly-reliable interconnect structure. In addition, since the cap layer is formed on each of the lower interconnections, a material having small capacitance is freely selected as a material for an insulating film deposited thereon.

In the method according to the second aspect, the surfaces of the lower interconnections are preferably lower than the surface of the first insulating film.

Then, the cap layer is easily formed only on the surfaces of the lower interconnections whose exposure should be prevented.

In the method according to the second aspect, an interconnection-to-interconnection space X between the lower interconnections sandwiching the low-dielectric-constant film preferably satisfies the following relationship:

$$S \leq X$$

where S is a minimum interconnection-to-interconnection space between the lower interconnections formed at a minimum resolution of lithography.

In this manner, in the method according to the second aspect, not an air gap but a low-dielectric-constant film is buried in the interconnection-to-interconnection gap, so that the upper limit of the interconnection-to-interconnection space does not need to be provided. Accordingly, the flexibility in design is enhanced.

In the method of the second aspect, the low-dielectric-constant film is preferably located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

Then, even when misalignment occurs, it is possible to prevent formation of an air gap at both sides of the lower interconnection connected to the connection portion. Accordingly, occurrence of failures in the connecting hole is prevented.

Preferably, in the method according to the second aspect, the interconnection-to-interconnection gap is formed using a resist pattern as a mask, and the resist pattern has an opening pattern for exposing a region which is located between the lower interconnections and in which the interconnection-to-interconnection gap is to be formed and a region expanded from that region toward the lower interconnections sandwiching the region by a distance z satisfying the following relationship:

$$z = L/2$$

where L is the minimum interconnection width of the lower interconnections formed at the minimum resolution of lithography.

Then, since the resist pattern has the opening pattern with which a region between the lower interconnections where an interconnection-to-interconnection gap is to be formed is exposed, an opening region does not become small and an interconnection-to-interconnection gap having a sufficient opening is formed even when misalignment occurs.

A method for fabricating a semiconductor device according to a third aspect of the present invention includes the steps of: forming a plurality of lower interconnections at intervals in a first insulating film; forming a second insulating film over the lower interconnections and the first insulating film; removing a portion of the first insulating film located between the lower interconnections and a portion of the second insulating film located on the portion of the first insulating film, thereby forming an interconnection-to-interconnection gap; forming a third insulating film over the second insulating film and the first insulating film in which the interconnection-to-interconnection gap is formed such that an air gap is formed out of the interconnection-to-interconnection gap; and forming, in the third insulating film, a connection portion connected to one of the lower interconnections and an upper interconnection connected to the connection portion, wherein the connection portion is formed to be connected to one of the lower interconnections not adjacent to the air gap.

With the method according to the third aspect, the connection portion is formed to be connected to one of the lower interconnections not adjacent to the air gap, so that it is possible to prevent penetration of a connecting hole through the air gap during formation of the connecting hole even at the occurrence of misalignment. In this manner, a semiconductor device including a highly-reliable multilayer interconnect structure in which interconnection-to-interconnection capacitance is reduced by forming the air gap between the lower interconnections and occurrence of failures in the connecting hole is prevented is implemented.

In the method according to the third aspect, an interconnection-to-interconnection space X between the lower interconnections sandwiching the air gap preferably satisfies the following relationship:

$$S \leq X < 3S$$

where S is a minimum interconnection-to-interconnection space between the lower interconnections formed at a minimum resolution of lithography.

The provision of the upper limit (3S) of the interconnection-to-interconnection space described above enables suppression of decrease of interconnection-to-interconnection capacitance. In addition, formation of the air gap becomes easy, so that an additional step for forming the air gap is not needed, thus reducing the throughput.

In the method according to the third aspect, the air gap is preferably located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

Then, since the resist pattern has the opening pattern with which a region between the lower interconnections where an interconnection-to-interconnection gap is to be formed is exposed, an opening region does not become small and an interconnection-to-interconnection gap having a sufficient opening is formed even when misalignment occurs.

Preferably, in the method according to the third aspect, the air gap is formed using, as a mask, a first resist pattern having a first opening pattern for exposing a first region. The first opening pattern is preferably formed so as to have the first region exposed by swelling a second resist pattern having a second opening pattern for exposing a second region, which is located between the lower interconnections and wider than the first region.

In this manner, the swelling process makes the first region, which is exposed in the first opening pattern, narrower than the second region between the lower interconnections, so that the first opening pattern is finer than a pattern formed at the minimum resolution of lithography. Accordingly, even when misalignment occurs, it is possible to prevent lower interconnections from being exposed under the removed second insulating film, so that the lower interconnections are not damaged.

In the method according to the third aspect, the first resist pattern is preferably formed by causing a second resist pattern to swell toward the midpoint between the lower interconnections by a distance q satisfying the relationship:

$$q = L/3$$

where L is the minimum interconnection width of the lower interconnections formed at the minimum resolution of lithography.

Then, even when misalignment occurs, exposure of the lower interconnections under the removed second insulating film is prevented without fail, thus ensuring prevention of damage on the lower interconnections.

The method according to the third aspect preferably further includes the step of planarizing the surface of the second insulating film by CMP after the step of forming the second insulating film and before the step of forming the upper interconnection and the connection portion.

A semiconductor device according to a first aspect of the present invention includes: a plurality of lower interconnections formed at intervals in a first insulating film; a second insulating film formed over the lower interconnections and the first insulating film; a connection portion formed in the second insulating film and connected to one of the lower interconnections; and an upper interconnection formed in the second insulating film and connected to the connection portion, wherein between the lower interconnections, an air gap is formed by covering, with the second insulating film, an interconnection-to-interconnection gap formed by removing a portion of the first insulating film between the lower interconnections, and the connection portion is connected to one of the lower interconnections not adjacent to the air gap.

In the semiconductor device according to the first aspect, the connection portion is connected to one of the lower interconnections not adjacent to the air gap, so that it is possible to prevent penetration of a connecting hole through the air gap during formation of the connecting hole even at the occurrence of misalignment. In this manner, a semiconductor device including a highly-reliable multilayer interconnect structure in which interconnection-to-interconnection capacitance is reduced by forming the air gap between the lower interconnections and occurrence of failures in the connecting hole is prevented is implemented.

In the device according to the first aspect, an interconnection-to-interconnection space X between the lower interconnections sandwiching the air gap preferably satisfies the following relationship:

$$S \leq X < 3S$$

where S is a minimum interconnection-to-interconnection space between the lower interconnections formed at a minimum resolution of lithography.

The provision of the upper limit (3S) of the interconnection-to-interconnection space described above enables suppression of decrease of interconnection-to-interconnection capacitance. In addition, formation of the air gap becomes easy, so that an additional step for forming the air gap is not needed, thus reducing the throughput.

In the device according to the first aspect, the air gap is preferably located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

Then, even when misalignment occurs, it is possible to prevent an air gap from being formed at both sides of the lower interconnection connected to the connection portion. This prevents occurrence of failures in the connecting hole.

A semiconductor device according to a second aspect of the present invention includes: a plurality of lower interconnections formed at intervals in a first insulating film; a second insulating film formed over the lower interconnections and the first insulating film; a connection portion formed in the second insulating film and connected to one of the lower interconnections; and an upper interconnection formed in the second insulating film and connected to the connection portion, wherein between the lower interconnections, a low-dielectric-constant film is formed to fill an interconnection-to-interconnection gap formed by removing a portion of the first insulating film between the lower interconnections, and is covered with the second insulating film, and the connection portion is connected to one of the lower interconnections not adjacent to the low-dielectric-constant film.

In the semiconductor device according to the second aspect, the connection portion is connected to one of the lower interconnections not adjacent to the low-dielectric-constant film, so that it is possible to prevent exposure of the low-dielectric-constant film during formation of the connecting hole even at the occurrence of misalignment. Accordingly, it is possible to prevent opening failures (via resist poisoning) such as contamination inside the connecting hole from occurring even at the occurrence of misalignment. As compared to the semiconductor device according to the first aspect, though the interconnection-to-interconnection capacitance increases, a level difference is less likely to be formed in the surface of the second insulating film because the low-dielectric-constant film is buried in the interconnection-to-interconnection gap. Accordingly, the process step of planarizing the level difference can be omitted. Therefore, with the method according to the second aspect, it is possible to use a low-κ material, whose application to a conventional semiconductor fabrication process has been difficult because planarization is difficult because of its properties, for example. In this manner, a semiconductor device including a highly-reliable multilayer interconnect structure in which occurrence of failures in the connecting hole is prevented is implemented.

In the device according to the second aspect, an interconnection-to-interconnection space X between the lower interconnections sandwiching the low-dielectric-constant film preferably satisfies the following relationship:

$$S \leq X$$

where S is a minimum interconnection-to-interconnection space between the lower interconnections formed at a minimum resolution of lithography.

In this manner, in the semiconductor device according to the second aspect, not an air gap but a low-dielectric-constant film is buried in the interconnection-to-interconnection gap, so that the upper limit of the interconnection-to-interconnection space does not need to be provided. Accordingly, the flexibility in design is enhanced.

In the device according to the second aspect, the low-dielectric-constant film is preferably located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

Then, even when misalignment occurs, it is possible to prevent formation of an air gap at both sides of the lower interconnection connected to the connection portion. Accordingly, occurrence of failures in the connecting hole is prevented.

In the device according to the first or second aspect, a cap layer is preferably formed between each of the surfaces of the lower interconnections and the second insulating film.

Then, each of the lower interconnections is covered with the cap layer, so that exposure of the lower interconnections is prevented during formation of the interconnection-to-interconnection gap or the connecting hole even at the occurrence of misalignment. Accordingly, the lower interconnections are not damaged, thus implementing a highly-reliable interconnect structure. In addition, since the cap layer is formed on each of the lower interconnections, a material having small capacitance is freely selected as a material for an insulating film deposited thereon.

In the device according to the first or second aspect, it is preferable that the cap layer has a width larger than the interconnection width of the lower interconnections and has an eave for an associated one of the lower interconnections.

Then, during the second insulating film, the second insulating film growing on the eaves covers the interconnection-to-interconnection gap, so that a large air gap is formed. Accordingly, interconnection-to-interconnection capacitance is further reduced.

In the semiconductor device according to the first or second aspect, the surfaces of the lower interconnections are preferably lower than the surface of the first insulating film.

Then, the cap layer is easily formed only on the surfaces of the lower interconnections whose exposure should be prevented.

A semiconductor device according to a third aspect of the present invention includes: a plurality of lower interconnections formed at intervals in a first insulating film; a second insulating film formed over the lower interconnections and the first insulating film; a third insulating film formed on the second insulating film; a connection portion formed in the third insulating film and connected to one of the lower interconnections; and an upper interconnection formed in the third insulating film and connected to the connection portion, wherein between the lower interconnections, an air gap is formed by covering, with the third insulating film, an interconnection-to-interconnection gap formed by removing a portion of the first insulating film between the lower interconnections and a portion of the second insulating film on the portion of the first insulating film, and the connection portion is connected to one of the lower interconnections not adjacent to the air gap.

In the semiconductor device according to the third aspect, the connection portion is connected to one of the lower interconnections not adjacent to the air gap, so that it is possible to prevent penetration of a connecting hole through the air gap during formation of the connecting hole even at the occurrence of misalignment. In this manner, a semiconductor device including a highly-reliable multilayer interconnect structure in which interconnection-to-interconnection capacitance is reduced by forming the air gap between the lower interconnections and occurrence of failures in the connecting hole is prevented is implemented.

In the device according to the third aspect, an interconnection-to-interconnection space X between the lower interconnections sandwiching the air gap preferably satisfies the following relationship:

$$S \leq X < 3S$$

where S is a minimum interconnection-to-interconnection space between the lower interconnections formed at a minimum resolution of lithography.

The provision of the upper limit (3S) of the interconnection-to-interconnection space described above enables suppression of decrease of interconnection-to-interconnection capacitance. In addition, formation of the air gap becomes easy, so that an additional step for forming the air gap is not needed, thus reducing the throughput.

In the device according to the third aspect, the air gap is preferably located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

Then, even when misalignment occurs, it is possible to prevent an air gap from being formed at both sides of the lower interconnection connected to the connection portion. This prevents occurrence of failures in the connecting hole.

In the device according to the third aspect, the second insulating film preferably has an eave projecting from the edge of the each of the lower interconnections adjacent to the air gap.

Then, during formation of the third insulating film, the third insulating film growing on the eaves covers the interconnection-to-interconnection gap, so that a large air gap is formed. Accordingly, interconnection-to-interconnection capacitance is further reduced.

In the device according to the third aspect, the eave of the second insulating film preferably projects from the edge of the each of the lower interconnections by a distance of L/3 where L is a minimum interconnection width of the lower interconnections formed at a minimum resolution of lithography.

Then, the second insulating film has an eave projecting by the distance of L/3, so that the lower interconnections are not exposed during formation of an interconnection-to-interconnection gap even when misalignment occurs. Accordingly, the lower interconnections are not damaged.

In the device according to the first, second or third aspect, each of the lower interconnections and the upper interconnection is preferably made of a metal mainly containing Cu.

In the device according to the first or second aspect, each of the first and second insulating films is preferably made of $SiO_2$, FSG, SiOC or an organic polymer.

In the device according to the third aspect, each of the first and third insulating films is preferably made of $SiO_2$, FSG, SiOC or an organic polymer.

In the device according to the first or second aspect, the cap layer is preferably made of one or more materials selected from the group consisting of Ta, TaN, Ti, TIN, W, WCoP, CoB and NiMoP.

In the device according to the first, second or third aspect, the bottom of the interconnection-to-interconnection gap is preferably located at a position deeper than the bottom of one of the lower interconnections adjacent to the interconnection-to-interconnection gap by about ⅓ of the interconnection width of the lower interconnection.

DETAILED DESCRIPTION OF THE INVENTION

Hereinafter, embodiments of the present invention will be described with reference to the drawings.

Embodiment 1

A semiconductor device and a method for fabricating the device according to a first embodiment of the present invention will be described with reference to FIGS. 1A through 1E and FIGS. 2A through 2D.

Figure 1A:
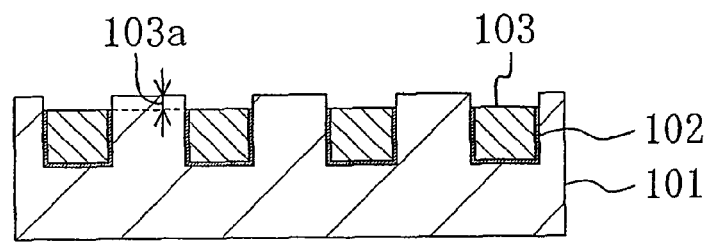
FIGS. 1A through 1E are cross-sectional views of main portions showing a method for fabricating a semiconductor device according to a first embodiment of the present invention.

First, as shown in FIG. 1A, a first insulating film 101 is deposited over a semiconductor substrate (not shown) in which a semiconductor active device is formed, and then recesses to be interconnect trenches are formed in the first insulating film 101 by lithography and dry etching. Subsequently, a barrier metal film is deposited over the first insulating film 101 including the bottoms and walls of the recesses, and then a metal film made of, for example, a copper film is deposited so that the recesses are filled therewith. Thereafter, portions of the barrier metal film and the metal film extending off the recesses in the first insulating film 101 are removed by chemical mechanical polishing (CMP), thereby forming first barrier metal films 102 and first interconnections 103, respectively.

In this embodiment, the first insulating film 101 is a silicon dioxide ($SiO_2$) film. Alternatively, any of other insulating materials for use in semiconductor processing, e.g., FSG or a low-κ material, may be used. The first barrier metal films 102 are generally made of tantalum (Ta), tantalum nitride (TaN) or a multilayer structure of these materials.

As shown in FIG. 1A, recesses 103a are formed such that the surfaces of the first interconnections 103 are lower than the surface of the first insulating film 101. Such a structure is formed by excessively performing removal and polishing with the conditions for the CMP process described above adjusted.

Figure 1B:
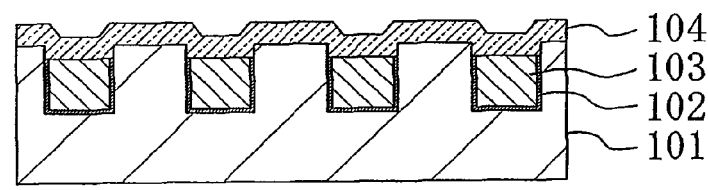

Next, as shown in FIG. 1B, a cap metal film 104 is deposited over the first insulating film 101 and the first interconnections 103.

As the first barrier metal films 102, the cap metal film 104 may be made of tantalum (Ta), tantalum nitride (TaN) or a multilayer structure of these materials. The cap metal film 104 is deposited to have a thickness larger than that of the recesses 103a.

Figure 1C:
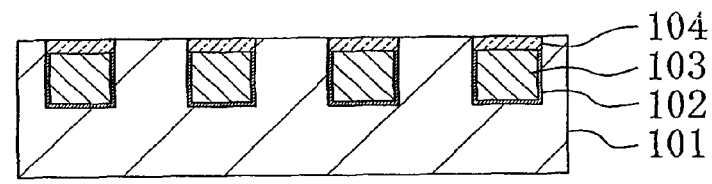

Then, as shown in FIG. 1C, portions of the cap metal film 104 remaining on the first insulating film 101 are removed by CMP such that the resultant cap metal films 104 have a thickness equal to that of the recesses 103a.

Figure 1D:
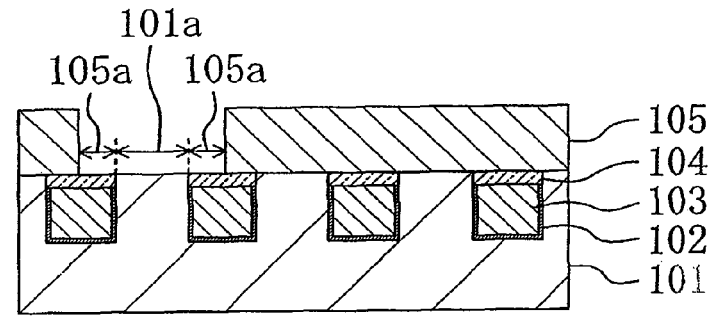

Thereafter, as shown in FIG. 1D, a resist pattern 105 for forming an air gap is formed on the first insulating film 101 and the cap metal films 104. The resist pattern 105 is a pattern for removing a portion of the first insulating film 101 located between selected ones of the first interconnections 103. Specifically, the resist pattern 105 has an opening pattern for exposing a portion 101a of the first insulating film 101 between the selected first interconnections 103 and also exposing portions 105a on the upper faces of the cap metal films 104 sandwiching the portion 101a. In this manner, the resist pattern 105 has the opening pattern in which a separation for exposing the portions 105a as well as the portion 101a is provided in consideration of occurrence of misalignment of the resist pattern 105. The length of the separation corresponding to the portions 105a is half of the minimum interconnection width of an interconnection formed at the minimum resolution of lithography. This will be specifically described later.

Figure 1E:
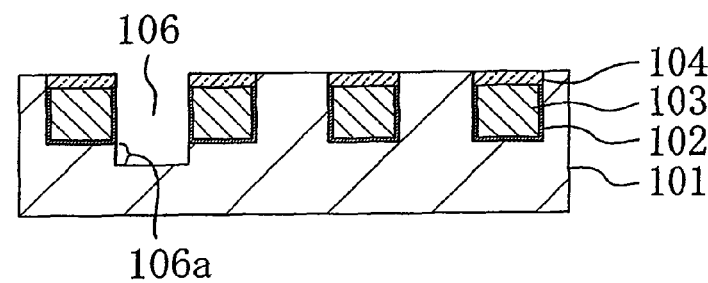

Then, as shown in FIG. 1E, etching is performed using the resist pattern 105 as a mask to remove a portion of the first insulating film 101 located between the first interconnections 103, thereby forming an interconnection-to-interconnection gap 106. In this case, the cap metal films 104 adjacent to a region in which the interconnection-to-interconnection gap 106 is to be formed is not etched at all under the etching conditions, so that the interconnection-to-interconnection gap 106 is easily formed with self-alignment. In addition, as the etching for forming the interconnection-to-interconnection gap 106, isotropic etching using a small amount of ion components is performed, so that the edges of the first interconnections 103 are not rounded. In forming the interconnection-to-interconnection gap 106, the amount of a recessed portion 106a at the bottom of interconnection-to-interconnection gap 106 is adjusted, so that it is possible to finely adjust the interconnection-to-interconnection capacitance. In this case, the depth of the recessed portion 106a is set at about ⅓ of the interconnection width of the first interconnections 103. This value is determined in consideration of the necessity of preventing an air gap, which will be formed in a subsequent process step, from reaching the bottom of an upper-level interconnection, which will be also formed in a subsequent process step, and the necessity of adjusting the interconnection-to-interconnection capacitance. However, the present invention is not limited to this value, and the depth of the recessed portion 106a may be set at another value.

An advantage in this process step is that the first interconnections 103 made of copper films are not damaged at all during the etching for forming the interconnection-to-interconnection gap 106. This is because the first interconnections 103 are covered with the cap metal films 104 and, therefore, the surfaces of the first interconnections 103 are not exposed during the etching. This aspect makes this embodiment differ from the conventional example in which etching damage occurs in the copper interconnect structure. Since the surfaces of the first interconnections 103 are covered with the cap metal films 104, the first interconnections 103 are not damaged even at the occurrence of a shift of the resist pattern 105 due to misalignment, in the same manner. Accordingly, it is possible to prevent etching damage on the surfaces of the first interconnections 103, so that the structure of this embodiment is very useful for enhancing the yield and reliability of the first interconnections 103 and also effective in preventing peeling of insulating films formed on the first interconnections 103 and also in preventing occurrence of cracks. In addition, when the first interconnections 103 are subjected to etching damage, contamination of etching apparatus caused by scattering of copper in the apparatus is a problem. However, the process step described above prevents etching damage on the first interconnections 103, so that the problem of contamination of the etching apparatus does not occur.

Figure 2A:
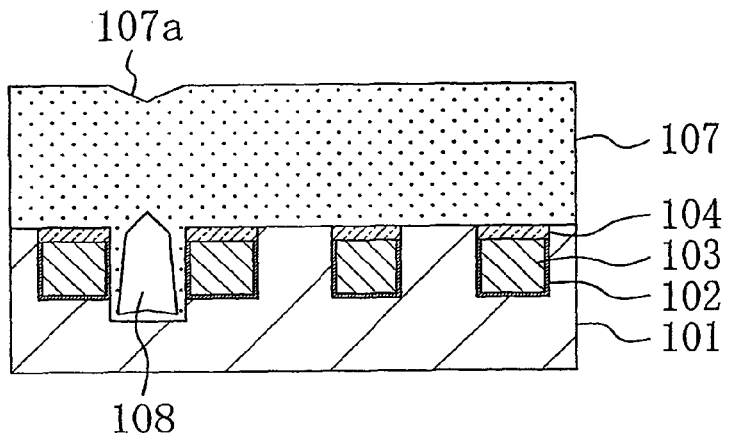
FIGS. 2A through 2D are cross-sectional views of main portions showing the method for fabricating a semiconductor device according to the first embodiment.

Then, as shown in FIG. 2A, a second insulating film 107 is deposited over the first insulating film 101, the cap metal films 104 and the interconnection-to-interconnection gap 106, thereby forming an air gap 108 out of the interconnection-to-interconnection gap 106 between the first interconnections 103. As a material for the second insulating film 107, a material exhibiting poor step coverage is preferably used because the purpose in using this material is to form the air gap 108 out of the interconnection-to-interconnection gap 106. In this embodiment, $SiO_2$ is used as a material for the second insulating film 107. Alternatively, any of other insulating materials for use in semiconductor processing, e.g., FSG or a low-κ material, may be used. In the conventional example, an insulating film deposited after formation of the first interconnections 103 is made of SiN or SiC(N) forming an insulating film preventing diffusion of copper. On the other hand, in this embodiment, since the cap metal films 104 are formed on the surfaces of the first interconnections 103, prevention of copper diffusion does not need to be taken into consideration. Accordingly, a material having small capacitance is freely selected as a material for the second insulating film 107. In addition, a level difference 107a is formed in a surface portion of the second insulating film 107 above the air gap 108.

Figure 2B:
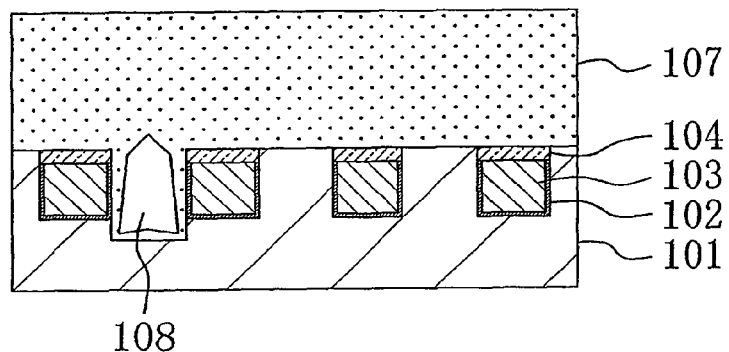

Thereafter, as shown in FIG. 2B, the surface of the second insulating film 107 including the level difference 107a is planarized by CMP.

Figure 2C:
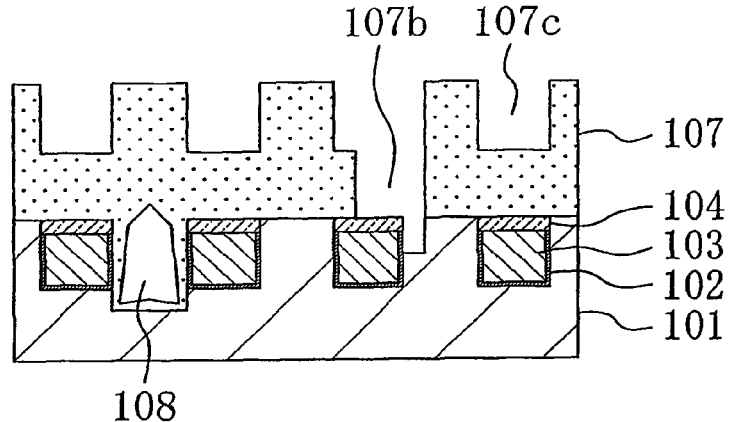

Subsequently, as shown in FIG. 2C, lithography and dry etching are performed to form, in the second insulating film 107, a connecting hole 107b in which one of the cap metal films 104 is exposed and interconnect trenches 107c. As in the conventional example, the connecting hole 107b and the interconnect trenches 107c are formed by a dual damascene process.

FIG. 2C shows a state in which the connecting hole 107b slightly shifts from an associated one of the first interconnections 103 at the occurrence of misalignment. Even in such a case where misalignment occurs, failures such as penetration of the connecting hole 107b through the air gap 108 do not occur at all because no air gap 108 is formed at both sides of the first interconnection 103 to which the connecting hole 107b is connected.

In addition, since the surfaces of the first interconnections 103 are covered with the cap metal films 104, the first interconnections 103 are not exposed during etching for forming the connecting hole 107b. Accordingly, the same advantages as those in the etching shown in FIG. 1E are obtained.

Figure 2D:
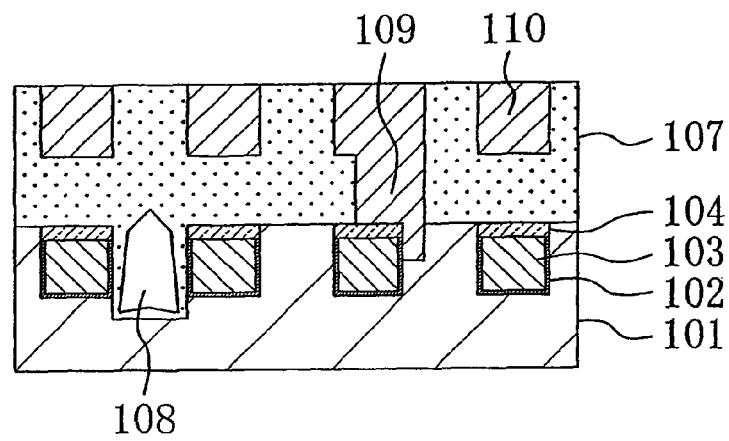

Thereafter, as shown in FIG. 2D, a metal film is buried in the connecting hole 107b and the interconnect trenches 107c, and then portions of the metal film extending off the connecting hole 107b and the interconnect trenches 107c are removed by CMP, thereby forming a via 109 and second interconnections 110.

Figure 3:
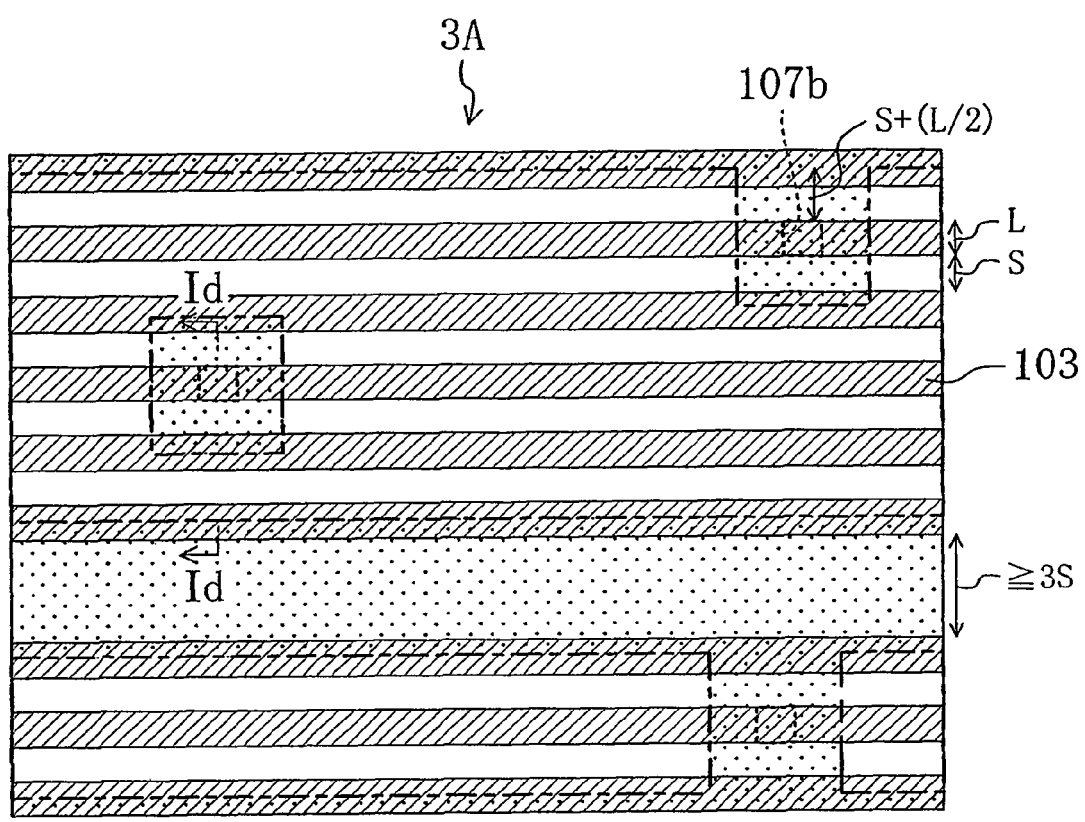
FIG. 3 is a plan view illustrating a mask layout of a resist pattern according to the first embodiment.

Now, a mask layout 3A for forming the resist pattern 105 for use in the process step shown in FIG. 1D will be specifically described with reference to FIG. 3. FIG. 3 is a schematic plan view for describing an example of a mask layout of the resist pattern shown in FIG. 1D. FIG. 1D corresponds to a cross-sectional view taken along the line Id-Id shown in FIG. 3.

In FIG. 3, the interconnection width (minimum interconnection width) of the first interconnections 103 formed at the minimum resolution of lithography is represented as L and the distance between the first interconnections 103 (minimum interconnection-to-interconnection space) formed at the minimum resolution of lithography is represented as S. In FIG. 3, the positions of the connecting holes 107b (see, FIG. 2C) are also shown.

As illustrated in FIG. 3, the mask layout 3A of the resist pattern 105 includes: a mask region 3a (provided with dots) covering, with a resist, regions the connecting holes 107b and a region in which the first interconnections 103 are widely spaced; and an opening region 3b (provided with no dots) for exposing the other region.

The mask layout 3A is formed by automatic design in which a region having an interconnection-to-interconnection space wider than or equal to S and narrower than 3S is automatically detected and an opening region is formed in the detected region. In this case, the opening region is expanded by a distance of L/2 toward the first interconnections 103 adjacent to a portion where an opening is to be formed. In addition, in this case, in a case where the edge of the expanded opening region overlaps with the edges of another expanded opening region, the overlapping edges are merged to form one figure, i.e., one opening region. With respect to the regions for the connecting holes 107b, a mask region is formed so as to mask portions each expanded by S+(L/2) from an associated one of the regions where the connecting holes 107b are to be formed, and then this mask region is subtracted from the previously-formed opening region. In this manner, the mask layout 3A including the mask region 3a and the opening region 3b for forming the resist pattern 105 shown in FIG. 1D is designed.

Now, first, a reason for detecting a region having an interconnection-to-interconnection distance (space) larger than or equal to S and less than 3S, i.e., a reason for setting the upper limit of the interconnection-to-interconnection space at a value less than 3S, will be specifically described with reference to FIG. 4.

Figure 4:
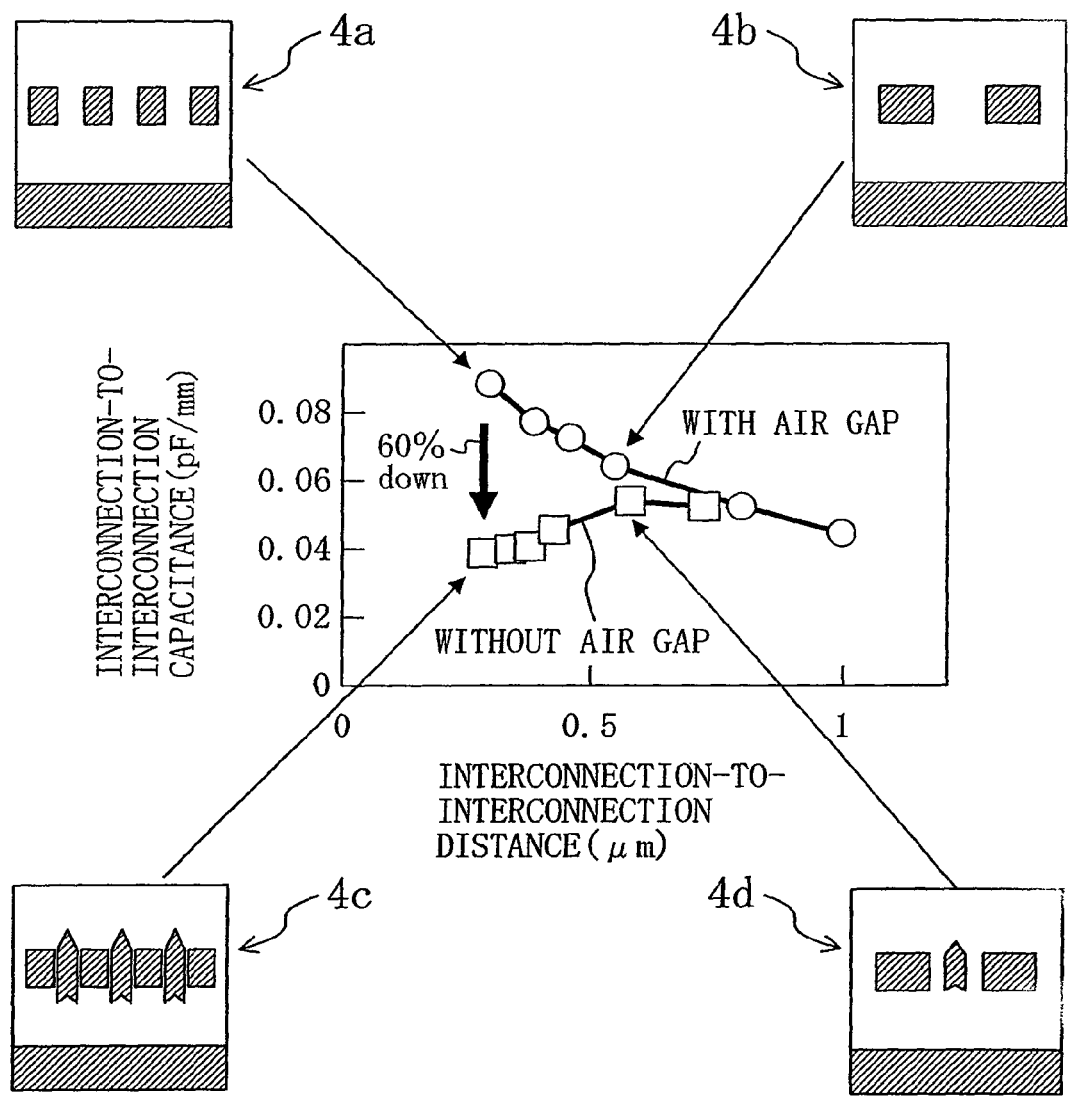
FIG. 4 is a graph showing a relationship between the interconnection-to-interconnection space and the interconnection-to-interconnection capacitance in the first embodiment.

FIG. 4 is a graph showing a relationship between the interconnection-to-interconnection space and the interconnection-to-interconnection capacitance. In FIG. 4, the ordinate represents the interconnection-to-interconnection capacitance value (pF/mm) and the abscissa represents the interconnection-to-interconnection space (μm). FIG. 4 is provided with supplementary views 4a, 4b, 4c and 4d schematically illustrating respective interconnect structures. The supplementary views 4a and 4b illustrate general cross-sectional structures of interconnection. The supplementary views 4c and 4d illustrate general cross-sectional structures in which air gaps are formed between interconnections.

First, as shown in FIG. 4, in a structure in which no air gaps are formed between interconnections, the parasitic capacitance value between interconnections increases as the interconnection-to-interconnection space decreases from the structure illustrated in the supplementary view 4b to the structure illustrated in the supplementary view 4a, for example. The increase of the parasitic capacitance value is pronounced at an interconnection-to-interconnection space of 0.5 μm or less, and at an interconnection-to-interconnection space of approximately 0.25 μm, the parasitic capacitance value is approximately twice as large as that at an interconnection-to-interconnection space of 1 μm.

On the other hand, as shown in FIG. 4, in a structure in which air gaps are formed between interconnections, e.g., in the structure illustrated in the supplementary view 4c, though the interconnection-to-interconnection space is small, the parasitic capacitance value is suppressed to substantially the same value as that in a structure in which no air gaps are formed, e.g., the structure illustrated in the supplementary view 4b. In particular, as compared to a structure in which no air gaps are formed, e.g., the structure illustrated in the supplementary view 4a, about 60% reduction of the parasitic capacitance value between interconnections is achieved.

In a structure in which the interconnection-to-interconnection space is wide, e.g., the interconnect structure including an air gap as illustrated in the supplementary view 4d, it is found that the parasitic capacitance value between interconnections does not largely differ from that in an interconnect structure in which no air gaps are formed as illustrated in, for example, the supplementary view 4b.

That is, the advantage obtained by forming air gaps between interconnections is significant in reduction of parasitic capacitance between interconnections when the interconnection-to-interconnection space is narrow, but is not significant when the interconnection-to-interconnection space is wide. Specifically, as illustrated in the supplementary views 4a and 4c, for example, when the interconnection-to-interconnection space is three or more times as wide as the minimum interconnection-to-interconnection space, e.g., is about 1 μm, an air gap does not need to be formed between interconnections, and a structure in which no air gaps are formed between interconnections, as illustrated in, for example, the supplementary view 4b is more preferable.

With respect to an interconnection-to-interconnection space suitable for formation of air gaps, a factor from the viewpoint of the fabrication process needs to be taken into consideration. In general, as the interconnection-to-interconnection space becomes narrower, it becomes more difficult to fill a gap between interconnections and voids are more likely to occur, so that air gaps are easily formed. On the other hand, as the interconnection-to-interconnection space becomes wider, it becomes easier to fill a gap between interconnections, so that formation of air gaps becomes inevitably difficult. Accordingly, an additional process for forming air gaps is needed, thus reducing the throughput. When the interconnection-to-interconnection space is 3S or more, there arises a problem in which a large level difference is formed in the surface of an insulating film deposited after formation of an air gap between interconnections so that subsequent planarization is difficult.

Accordingly, based on the distance between interconnections, i.e., the minimum interconnection-to-interconnection space called the interconnection-to-interconnection space, a structure including air gaps is preferably employed for an interconnection-to-interconnection space less than three times as wide as the minimum interconnection-to-interconnection space, whereas a structure including no air gaps is preferably employed for an interconnection-to-interconnection space three or more times as wide as the minimum interconnection-to-interconnection space.

Then, a reason for expanding the opening region 3b by a half of the minimum interconnection width L is associated with misalignment. Specifically, it is found that the misalignment occurs by the degree of about ⅓ of the minimum interconnection width L. In view of this, if the opening region 3b is expanded by L/2, it is possible to form interconnection-to-interconnection gaps 106 not only in part of regions between the first interconnections 103 but also in almost all the regions even in a case where misalignment occurs laterally. Accordingly, the interconnection-to-interconnection gaps 106 do not become small, and large air gaps 108 are formed.

A reason for masking portions expanded from regions where connecting holes 107b are formed by the distance S+(L/2) is also associated with the misalignment described above, and is to prevent formation of an opening region at both sides of the first interconnections 103 connected to the connecting holes 107b. Specifically, a resist pattern masking portions expanded from the formation regions of the connecting holes 107b by the distance of S+(L/2) prevents formation of an opening region at both sides of the first interconnections 103 connected to the connecting holes 107b even when misalignment occurs laterally. Accordingly, even when the connecting holes 107b shift laterally because of misalignment, a problem of making a connection hole and an interconnection-to-interconnection gap continuous as described above is prevented.

The use of the mask layout 3A designed as described above allows formation of a resist pattern 105 with which an air gap 108 is formed in an interconnection-to-interconnection space equal to or wider than S and narrower than 3S and no air gap 108 is formed at both sides of the first interconnection 103 connected to the second interconnection 110 through the via 109.

Embodiment 2

A semiconductor device and a method for fabricating the device according to a second embodiment of the present invention will be described with reference to FIGS. 5A through 5D and FIGS. 6A through 6D.

Figure 5A:
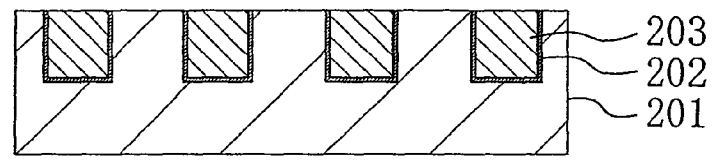
FIGS. 5A through 5D are cross-sectional views of main portions showing a method for fabricating a semiconductor device according to a second embodiment of the present invention.

First, as shown in FIG. 5A, a first insulating film 201 is deposited over a semiconductor substrate (not shown) in which a semiconductor active device is formed. Subsequently, recesses to be interconnect trenches are formed in the first insulating film 201 by lithography and dry etching. Then, a barrier metal film is deposited over the first insulating film 201 including the bottoms and walls of the recesses, and then a metal film made of, for example, a copper film is deposited so that the recesses are filled therewith. Thereafter, portions of the barrier metal film and the metal film extending off the recesses in the first insulating film 201 are removed by chemical mechanical polishing (CMP), thereby forming first barrier metal films 202 and first interconnections 203, respectively.

In this embodiment, the first insulating film 201 is a silicon dioxide ($SiO_2$) film. Alternatively, any of other insulating materials for use in semiconductor processing, e.g., FSG or a low-κ material, may be used. The first barrier metal films 202 are generally made of tantalum (Ta), tantalum nitride (TaN) or a multilayer structure of these materials.

Figure 5B:
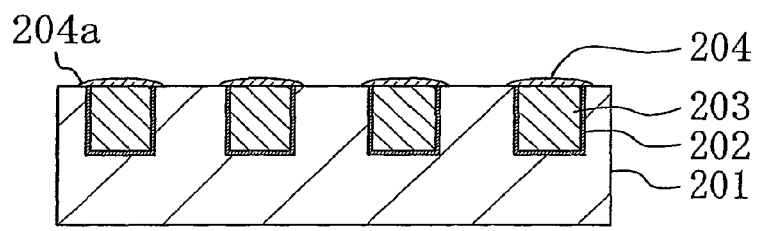

Next, as shown in FIG. 5B, cap metal films 204 made of a CoWP film are selectively deposited only over the upper faces of the first interconnections 203. In this embodiment, a CoWP film is used as the cap metal films 204. Alternatively, as the cap metal films 204 that can be selectively deposited, a CoB film or a NiMoP film, which can be selectively deposited only over metal interconnections may be used using electrodeless plating, as introduced in IITC2004 p. 75 "High Reliability Cu Interconnection Utilizing a Low Contamination CoWP layer" or other literatures. These selectively-deposited cap metal films 204 grow isotropically with respect to the surfaces of the first interconnections 203. Accordingly, each of the cap metal films 204 has features of being wider than an associated one of the first interconnections 203 and having eaves 204a projecting from the edges of the first interconnection 203.

Figure 5C:
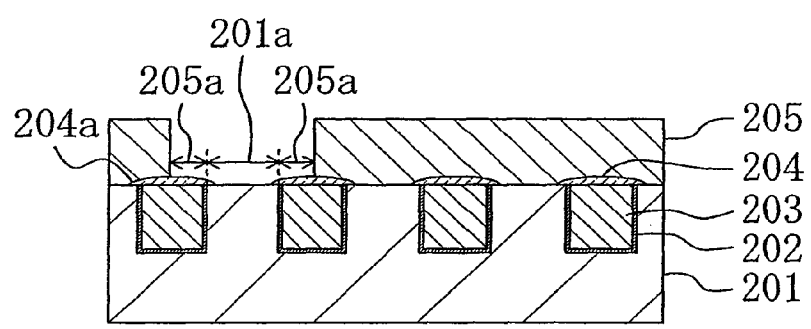

Thereafter, as shown in FIG. 5C, a resist pattern 205 for forming an air gap is formed on the first insulating film 201 and the cap metal films 204. The resist pattern 205 is a pattern for removing a portion of the first insulating film 201 located between selected ones of the first interconnections 203. Specifically, the resist pattern 205 has an opening pattern for exposing a portion 201a of the first insulating film 201 between the selected first interconnections 203 and also exposing portions 205a of the upper faces of the cap metal films 204 adjacent to the portion 201a. In this manner, the resist pattern 205 has the opening pattern in which a separation for exposing the portions 205a as well as the portion 201a is provided in consideration of occurrence of misalignment of the resist pattern 205. The length of the separation corresponding to the portions 205a is half of the minimum width of an interconnection formed at the minimum resolution of lithography. This will be specifically described later.

Figure 5D:
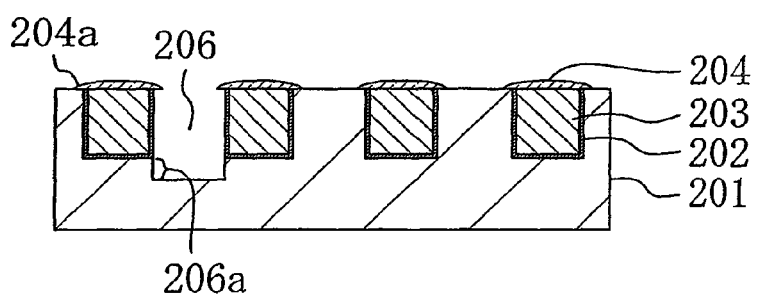

Then, as shown in FIG. 5D, etching is performed using the resist pattern 205 as a mask to remove a portion of the first insulating film 201 located between the first interconnections 203, thereby forming an interconnection-to-interconnection gap 206. In this case, the cap metal films 204 adjacent to a region in which the interconnection-to-interconnection gap 206 is to be formed is not etched at all under the etching conditions, so that the interconnection-to-interconnection gap 206 is easily formed in a self-aligned manner. In addition, as the etching for forming the interconnection-to-interconnection gap 206, isotropic etching using a small amount of ion components is performed, so that the eaves 204a of the cap metal films 204 remain without change to prevent rounding of the edges of the first interconnections 203. In forming the interconnection-to-interconnection gap 206, the amount of a recessed portion 206a at the bottom of the interconnection-to-interconnection gap 206 is adjusted, so that it is possible to finely adjust interconnection-to-interconnection capacitance. In this case, the depth of the recessed portion 206a is set at about ⅓ of the interconnection width of the first interconnections 203. This value is determined in consideration of the necessity of preventing an air gap, which will be formed in a subsequent process step, from reaching the bottom of an upper-level interconnection, which will be also formed in a subsequent process step, and of the necessity of adjusting the interconnection-to-interconnection capacitance. However, the present invention is not limited to this value, and the depth of the recessed portion 206a may be set at another value.

An advantage obtained by the foregoing process steps is that the first interconnections 203 made of copper films are not damaged at all during etching for forming the interconnection-to-interconnection gap 206. This is because the first interconnections 203 are covered with the cap metal films 204 so that the upper faces of the first interconnections 203 are not exposed during the etching. This structure makes this embodiment differ from the conventional example in which copper interconnections are subjected to etching damage. In addition, since the upper faces of the first interconnections 203 are covered with the cap metal films 204, the first interconnections 203 are not damaged either, even when the position of the resist pattern 205 shifts because of misalignment. In this manner, it is possible to prevent etching damage on the surfaces of the first interconnections 203, so that this embodiment is very useful for enhancing the yield and reliability of the first interconnections 203 and, in addition, for preventing peeling of insulating films formed on the first interconnections 203 and occurrence of cracks. Furthermore, if the first interconnections 203 are subjected to etching damage, there arises the problem of contamination of etching apparatus caused by scattering of copper into the apparatus. In the foregoing process steps, however, the first interconnections 203 are free from etching damage, so that the problem of contamination of etching apparatus does not arise.

Figure 6A:
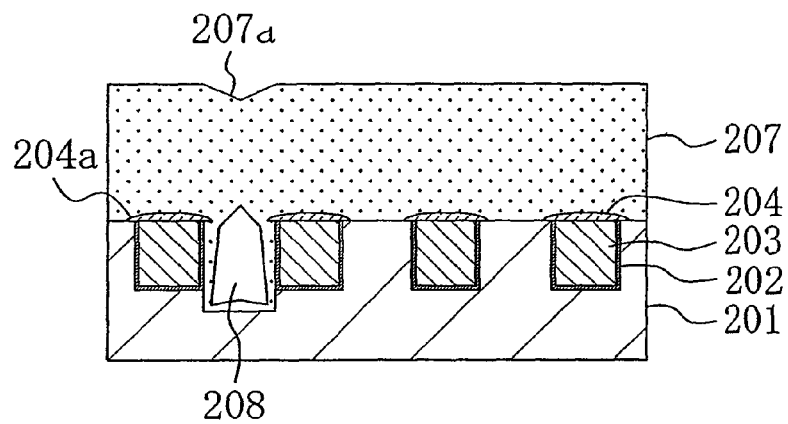
FIGS. 6A through 6D are cross-sectional views of main portions showing the method for fabricating a semiconductor device according to the second embodiment.

Then, as shown in FIG. 6A, a second insulating film 207 is deposited over the first insulating film 201, the cap metal films 204 and the interconnection-to-interconnection gap 206, thereby forming an air gap 208 out of the interconnection-to-interconnection gap 206 between the first interconnections 203. As a material for the second insulating film 207, a material exhibiting poor step coverage is preferably used because the purpose in using this material is to form the air gap 208 out of the interconnection-to-interconnection gap 206. In this embodiment, $SiO_2$ is used for the second insulating film 207. Alternatively, any of other insulating materials for use in semiconductor processing, e.g., FSG or a low-κ material, may be used. In the conventional example, an insulating film deposited after formation of the first interconnections 203 is made of, for example SiN or SiC(N) forming an insulating film preventing diffusion of copper. On the other hand, in this embodiment, since the cap metal films 204 are formed on the surfaces of the first interconnections 203, prevention of copper diffusion does not need to be taken into consideration. Accordingly, a material having small capacitance is freely selected as a material for the second insulating film 207. In addition, a level difference 207a is formed in a surface portion of the second insulating film 207 located above the air gap 208.

Figure 6B:
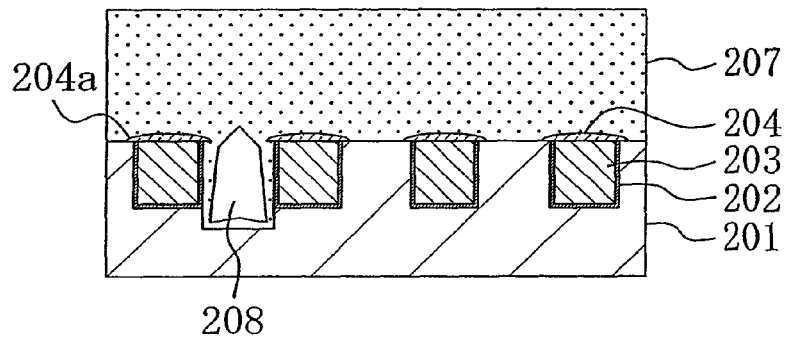

Thereafter, as shown in FIG. 6B, the surface of the second insulating film 207 including the level difference 207a is planarized by CMP.

Figure 6C:
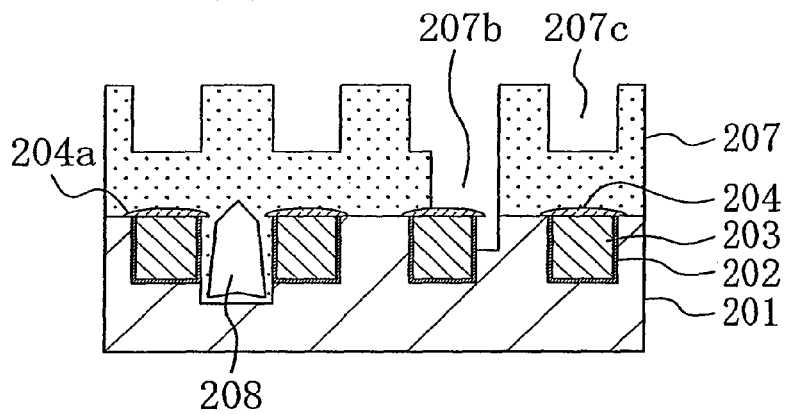

Subsequently, as shown in FIG. 6C, lithography and dry etching are performed to form, in the second insulating film 207, a connecting hole 207b in which one of the cap metal films 204 is exposed and interconnect trenches 207c. As in the conventional example, the connecting hole 207b and the interconnect trenches 207c are formed by a dual damascene process.

FIG. 6C shows a state in which the connecting hole 207b slightly shifts from an associated one of the first interconnections 203 at the occurrence of misalignment. Even in such a case where misalignment occurs, failures such as penetration of the connecting hole 207b through the air gap 208 do not occur at all because no air gap 208 is formed at both sides of the first interconnection 203 to which the connecting hole 207b is connected.

In addition, since the surfaces of the first interconnections 203 are covered with the cap metal films 204, the first interconnections 203 are not exposed during etching for forming the connecting hole 207b. Accordingly, the same advantages as those in the etching shown in FIG. 5D are obtained.

Figure 6D:
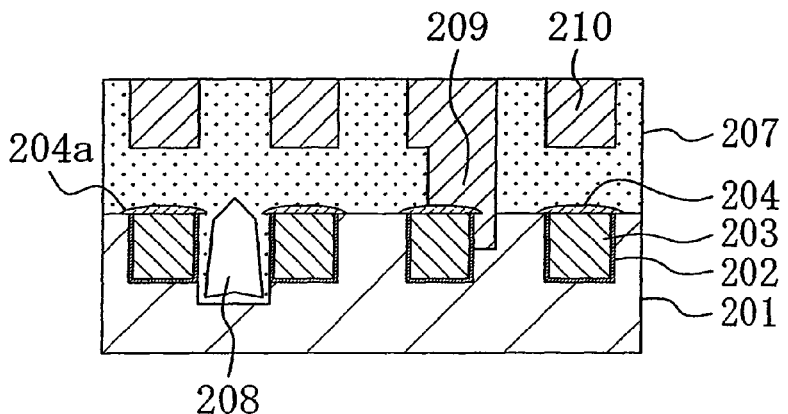

Thereafter, as shown in FIG. 6D, a metal film is buried in the connecting hole 207b and the interconnect trenches 207c, and then portions of the metal film extending off the connecting hole 207b and the interconnect trenches 207c are removed by CMP, thereby forming a via 209 and second interconnections 210.

A mask layout for forming the resist pattern used in the process step shown in FIG. 5C is the same as that illustrated in FIG. 3 in the first embodiment, and description thereof is herein omitted.

The second embodiment has the same advantages as those of the first embodiment, but is different from the first embodiment in the following aspects. That is, since the cap metal films 204 are provided with the eaves 204a, the second insulating film 207 formed on the eaves 204a covers the interconnection-to-interconnection gap 206 during deposition of the second insulating film 207 at a subsequent process step so that the air gap 208 having a larger size is formed. In addition, in the first embodiment, in the case of forming the cap metal films 204 on the first interconnections 203 having a large interconnection width, it is difficult to form the cap metal films 204 because of characteristics of CMP. On the other hand, the second embodiment has a great feature in which selective growth of metal is utilized to enable uniform deposition of the cap metal films 204 independently of the interconnection width of interconnections underlying the cap metal films 204.

Embodiment 3

A semiconductor device and a method for fabricating the device according to a third embodiment of the present invention will be described with reference to FIGS. 5A through 5D and FIGS. 7A through 7D.

First, as in the description with reference to FIGS. 5A through 5D, barrier metal films 302 and first interconnections 303 are formed in this order in recesses formed in a first insulating film 301. Thereafter, cap metal films 304 provided with eaves are formed, and then an interconnection-to-interconnection gap 306 is formed between the first interconnections 303.

Figure 7A:
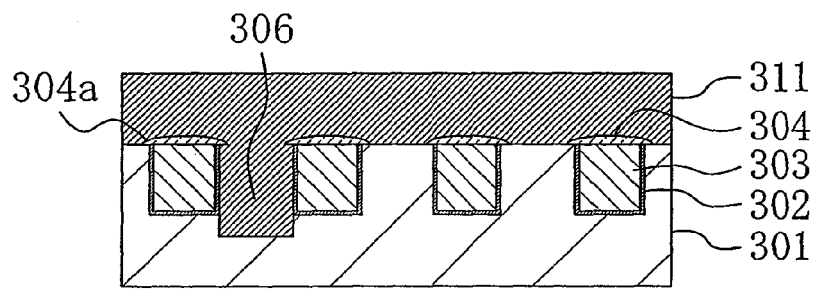
FIGS. 7A through 7D are cross-sectional views of main portions showing a method for fabricating a semiconductor device according to a third embodiment of the present invention.

Next, as shown in FIG. 7A, a low-κ material 311 is deposited over the first insulating film 301, the cap metal films 304 and the interconnection-to-interconnection gap 306. A feature of this embodiment is that a low-κ material having excellent flowability and formed by coating and baking is used as the low-κ material 311. The low-κ material is poured into the interconnection-to-interconnection gap 306 for coating. In this embodiment, a low-κ material mainly containing an organic material is used, but an inorganic coating material or a porous material may also be used.

Figure 7B:
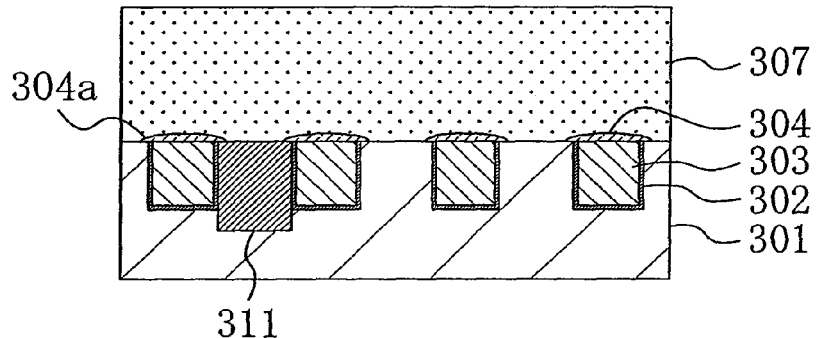

Then, as shown in FIG. 7B, after the low-κ material 311 has been sintered, portions of the low-κ material 311 extending off the interconnection-to-interconnection gap 306 is removed by, for example CMP or wet etching, thereby leaving the low-κ material 311 only inside the interconnection-to-interconnection gap 306. Subsequently, a second insulating film 307 is deposited over the first insulating film 301, the cap metal films 304 and the low-κ material 311. In the conventional example, an insulating film deposited after formation of the first interconnections 303 is made of SiN or SiC (N), for example, serving as an insulating film preventing diffusion of copper. On the other hand, in this embodiment, since the cap metal films 304 are formed on the surfaces of the first interconnections 303, prevention of Cu diffusion does not need to be taken into Consideration. Accordingly, a material having small capacitance is freely selected as a material for the second insulating film 307. In the first and second embodiments, formation of an air gap causes a level difference (107a, 207a) in the surface of the second insulating film (107, 207). On the other hand, in this embodiment, the low-κ material 311 is formed in the interconnection-to-interconnection gap 306 without formation of an air gap, so that no level difference is formed in the surface of the second insulating film 307 after deposition of the second insulating film 307. Accordingly, unlike the first and second embodiments, planarization using CMP is unnecessary after deposition of the second insulating film 307.

Figure 7C:
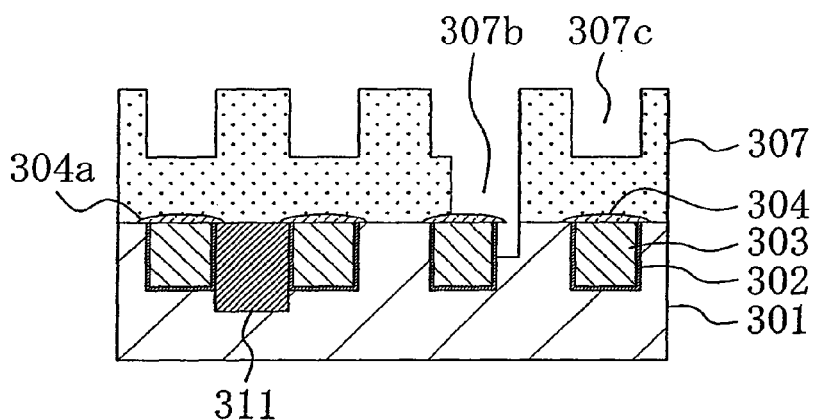

Thereafter, as shown in FIG. 7C, a connecting hole 307b in which one of the cap metal films 304 is exposed and interconnect trenches 307c are formed in the second insulating film 307 using lithography and dry etching. As in the conventional example, the connecting hole 307b and the interconnection trenches 307c are formed by a dual damascene process.

FIG. 7C shows a state in which the connecting hole 307b slightly shifts from an associated one of the first interconnections 303 at the occurrence of misalignment. Even in such a case where misalignment occurs, the low-κ material 311 is not exposed during formation of the connecting hole 307b and the interconnection trenches 307c because the low-κ material 311 does not exist at both sides of the first interconnection 303 to which the connecting hole 307b is connected. Accordingly, it is possible to prevent opening failures (via resist poisoning) such as contamination of the connecting hole 307b, caused during formation of a resist pattern for forming the interconnection trenches 307c after formation of the connecting hole 307b.

In addition, since the surfaces of the first interconnections 303 are covered with the cap metal films 304, the first interconnections 303 are not exposed during etching for forming the connecting hole 307b. Accordingly, the same advantages as those obtained in the etching for forming the interconnection-to-interconnection gap 306 are obtained.

Figure 7D:
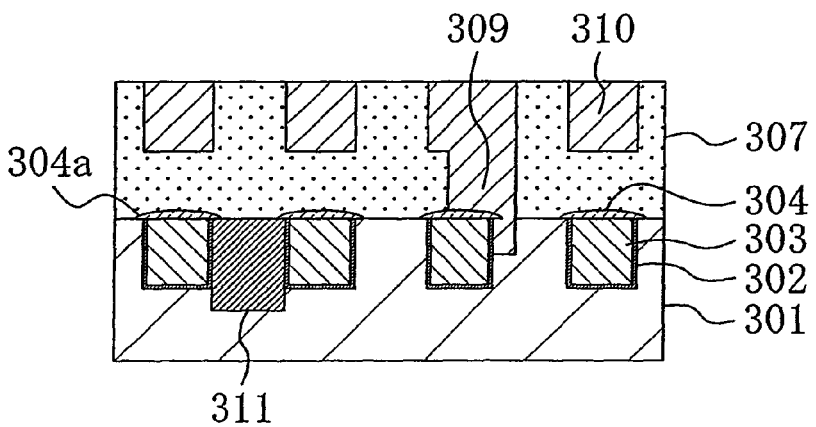

Then, as shown in FIG. 7D, metal films are buried in the connecting hole 307b and the interconnect trenches 307c, and then portions of the metal films extending off the connecting hole 307b and the interconnect trenches 307c are removed by CMP, thereby forming a via 309 and second interconnections 310.

The resist pattern used for forming the interconnection-to-interconnection gap 306 is the same as that for the mask layout described in the first embodiment, and description of the same part thereof is herein omitted. In the first and second embodiments, as shown in FIG. 3, a region where an interconnection-to-interconnection space is wider than or equal to S and narrower than 3S is detected by automatic design. On the other hand, in this third embodiment, the upper limit of 3S is not needed for the interconnection-to-interconnection space. This is because not an air gap but the low-κ material 311 is buried in the interconnection-to-interconnection gap 306, so that decrease of the interconnection-to-interconnection capacitance according to an interconnection-to-interconnection space do not need to be taken into consideration and no level difference is formed in the surface of the subsequently-deposited second insulating film 307, thus eliminating the necessity of providing the upper limit of the interconnection-to-interconnection space in consideration of a level difference formed in the surface, unlike the first and second embodiments.

Unlike the first and second embodiments in which an air gap is formed out of the interconnection-to-interconnection gap 306, the third embodiment has a characteristic which the low-κ material 311 is buried in the interconnection-to-interconnection gap 306. In this way, though the interconnection-to-interconnection capacitance increases, a level difference is less likely to be formed in the surface of the second insulating film 307. Accordingly, the process step of planarizing the surface of the deposited second insulating film 307 by CMP is not needed, thus reducing the number of fabrication process steps. In addition, in the third embodiment, it is possible to use a porous low-κ film, whose application to a conventional semiconductor fabrication process has been difficult because planarization is difficult because of properties of its material, for example.

In the third embodiment, the cap metal films 304 provided with eaves are formed on the first interconnections 303. Alternatively, as in the first embodiment, a structure in which recesses are formed on the first interconnections 303 and cap metal films 304 are deposited in the recesses may be employed. In such a case, the present invention can be implemented in the same manner.

Embodiment 4

A semiconductor device and a method for fabricating the device according to a fourth embodiment of the present invention will be described with reference to FIGS. 8A through 8E and FIGS. 9A through 9E.

Figure 8A:
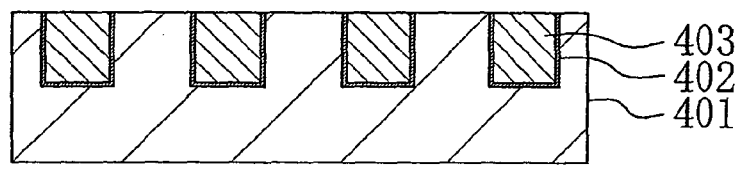
FIGS. 8A through 8E are cross-sectional views of main portions showing a method for fabricating a semiconductor device according to a fourth embodiment of the present invention.

First, as shown in FIG. 8A, a first insulating film 401 is deposited over a semiconductor substrate (not shown) in which a semiconductor active device is formed, and then recesses to be interconnect trenches are formed in the first insulating film 401 by lithography and dry etching. Subsequently, a barrier metal film is deposited over the first insulating film 401 including the bottoms and walls of the recesses, and then a metal film made of, for example, a copper film is deposited so that the recesses are filled therewith. Thereafter, portions of the barrier metal film and the metal film extending off the recesses in the first insulating film 401 are removed by chemical mechanical polishing (CMP), thereby forming first barrier metal films 402 and first interconnections 403, respectively.

In this embodiment, the first insulating film 401 is a silicon dioxide ($SiO_2$) film. Alternatively, any of other insulating materials for use in semiconductor processing, e.g., FSG or a low-κ material, may be used. The first barrier metal films 402 are generally made of tantalum (Ta), tantalum nitride (TaN) or a multilayer structure of these materials.

Figure 8B:
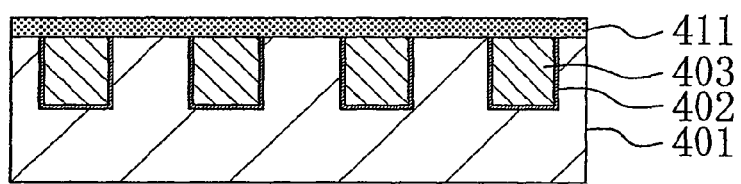

Next, as shown in FIG. 8B, to prevent diffusion of copper, a liner insulating film 411 made of SiN or SiC(N) is deposited over the first insulating film 401 and the first interconnections 403.

Figure 8C:
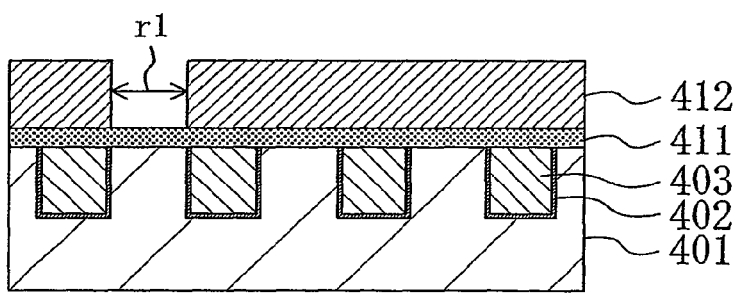

Then, as shown in FIG. 8C, to form an interconnection-to-interconnection gap, a resist pattern 412 is formed on the liner insulating film 411 by lithography. The resist pattern 412 has an opening pattern with which only a portion of the first insulating film 401 located between selected ones of the first interconnections 403 is removed. A feature of the resist pattern 412 is that the edges of the resist pattern 412 match the edges of the selected first interconnections 403. That is, an opening diameter r1 in the opening pattern of the resist pattern 412 is equal to the interconnection-to-interconnection space between the first interconnections 403.

Figure 8D:
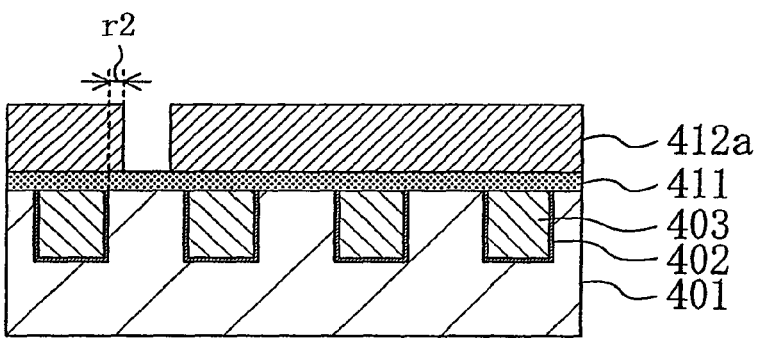

Then, as shown in FIG. 8D, surface processing is performed on the resist pattern 412, thereby swelling the resist pattern 412. In this case, the resist pattern 412 swells (to be changed into a resist pattern 412a) such that a region r2 where a portion of the first insulating film 401 between selected ones of the first interconnections 403 overlaps with the resist pattern 412 by about ⅓ of the interconnection-to-interconnection space. Then, suppose the minimum interconnection-to-interconnection space between the first interconnections 403 is S, a fine opening pattern having an opening diameter less than or equal to the interconnection-to-interconnection space S between interconnections formed at the minimum resolution of lithography is formed as an opening pattern of the resist pattern 412a. In this manner, even when misalignment occurs between the resist pattern 412a and the first interconnections 403, it is possible to prevent exposure of the first interconnections 403 in subsequent process steps. In addition, as shown in FIG. 8C, the edges of the resist pattern 412 and the edges of the first interconnections 403 match each other, so that the resist pattern used for forming the first interconnections 403 can also be used as the resist pattern 412. As described above, it is sufficient to provide preparation for misalignment by swelling the resist pattern 412 to form an opening pattern finer than that formed at the minimum resolution of lithography. Accordingly, the edges of the resist pattern 412 and the edges of the first interconnections 403 do not necessarily match each other.

Figure 8E:
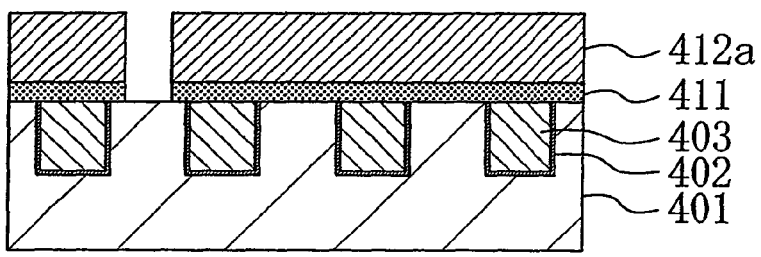

Thereafter, as shown in FIG. 8E, anisotropic etching is performed on the liner insulating film 411 using the resist pattern 412a formed at the process step shown in FIG. 8D as a mask, so that a portion of the liner insulating film 411 exposed in the opening pattern of the resist pattern 412a is vertically removed to have the upper face of the first insulating film 401 partly exposed. When the upper face of the first insulating film 401 is exposed in this manner, the etching is stopped.

Figure 9A:
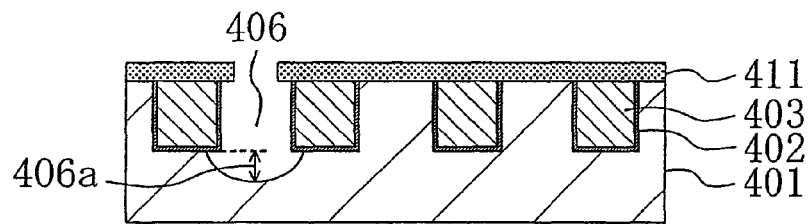
FIGS. 9A through 9E are cross-sectional views of main portions showing the method for fabricating a semiconductor device according to the fourth embodiment.

Then, as shown in FIG. 9A, etching having high selectivity with respect to a portion of the first insulating film 401 located between selected ones of the first interconnections 403 is performed, thereby forming an interconnection-to-interconnection gap 406. At this time, the liner insulating film 411 is not etched to remain. Because of this isotropic etching, a recessed portion 406a at the bottom of the interconnection-to-interconnection gap 406 is rounded. Instead of the isotropic etching, wet etching may be performed. In this manner, the resist pattern 412a projects from each of the first interconnections 403 to the degree corresponding to the region r2, so that the first interconnections 403 are not exposed from the face subjected to etching even at the occurrence of misalignment. Accordingly, the surfaces of the first interconnections 403 are not damaged. Since etching damage on the surfaces of the first interconnections 403 is prevented in this way, the structure of this embodiment is very useful for enhancing the yield and reliability of the first interconnections 403 and, in addition, for preventing peeling of insulating films formed on the first interconnections 403. Furthermore, if the first interconnections 403 are subjected to etching damage, there arises the problem of contamination of etching apparatus caused by scattering of copper into the apparatus. In the foregoing process steps, however, the first interconnections 403 are free from etching damage, so that the problem of contamination of etching apparatus does not occur.

Figure 9B:
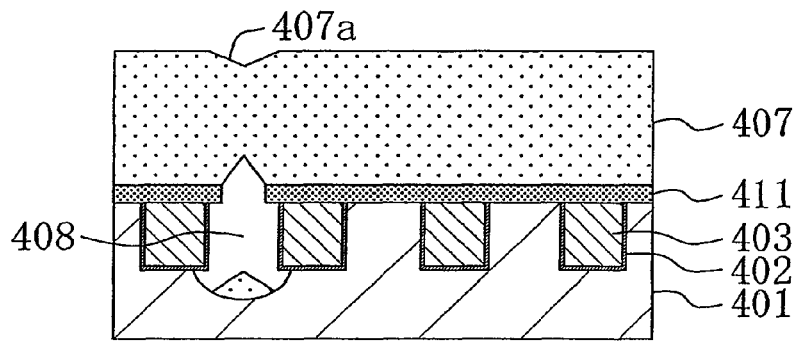

Thereafter, as shown in FIG. 9B, a second insulating film 407 is deposited over the first insulating film 401, the liner insulating film 411 and the interconnection-to-interconnection gaps 406, thereby forming an air gap 408 out of the interconnection-to-interconnection gap 406 between the first interconnections 403. As a Material for the second insulating film 407, a material exhibiting poor step coverage is preferably used because the purpose in using this material is to form the air gap 408 out of the interconnection-to-interconnection gap 406. In this embodiment, $SiO_2$ is used for the second insulating film 407. Alternatively, any of other insulating materials for use in semiconductor processing, e.g., FSG or a low-κ material, may be used. In the conventional example, an insulating film deposited after formation of the first interconnections 403 is made of SiN or SiC(N) forming an insulating film preventing diffusion of copper. On the other hand, in this embodiment, since liner insulating film 411 is formed on the surfaces of the first interconnections 403, prevention of copper diffusion does not need to be taken into consideration. Accordingly, a material having small capacitance is freely selected as a material for the second insulating film 407. In addition, a level difference 407a is formed in a surface portion of the second insulating film 407 located above the air gap 408.

Figure 9C:
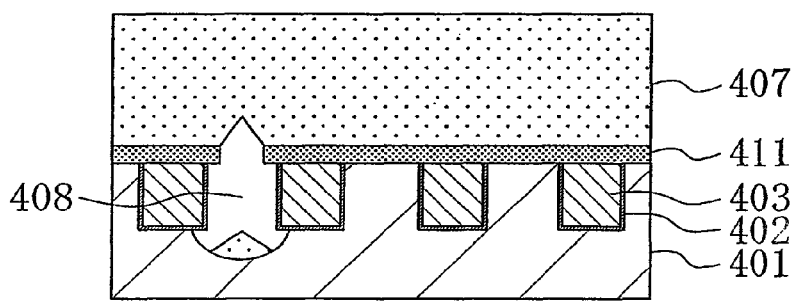

Thereafter, as shown in FIG. 9C, the surface of the second insulating film 407 including the level difference 407a is planarized by CMP.

Figure 9D:
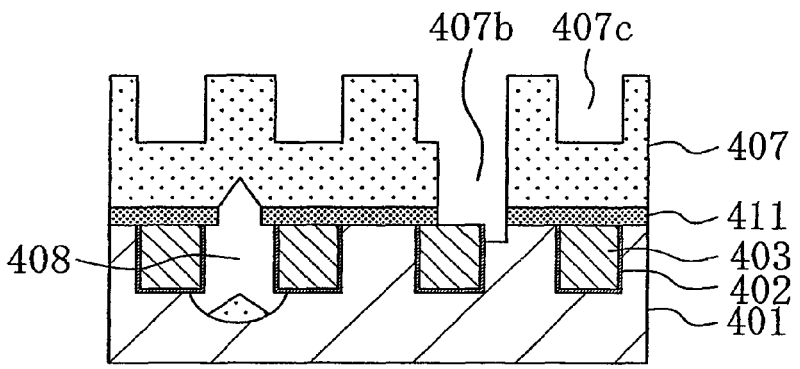

Subsequently, as shown in FIG. 9D, lithography and dry etching are performed to form, in the second insulating film 407, a connecting hole 407b in which one of the first interconnections 403 is exposed and interconnect trenches 407c. As in the conventional example, the connecting hole 407b and the interconnect trenches 407c are formed by a dual damascene process.

FIG. 9D shows a state in which the connecting hole 407b slightly shifts from an associated one of the first interconnections 403 at the occurrence of misalignment. Even in such a case where misalignment occurs, failures such as penetration of the connecting hole 407b through the air gap 408 do not occur at all because no air gap 408 is formed at both sides of the first interconnection 403 to which the connecting hole 407b is connected.

Figure 9E:
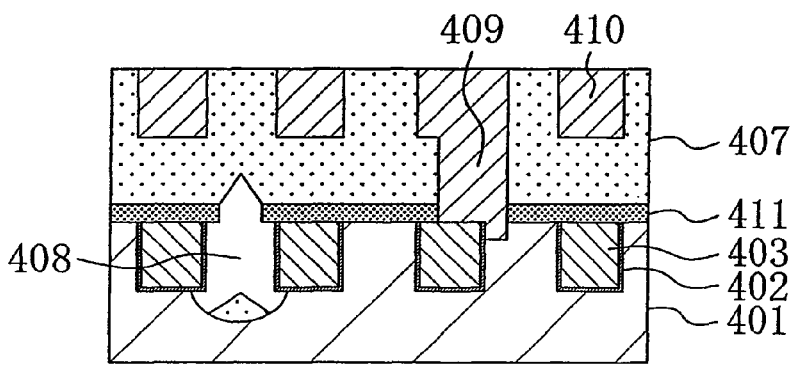

Thereafter, as shown in FIG. 9E, a metal film is buried in the connecting hole 407b and the interconnect trenches 407c, and then portions of the metal film extending off the connecting hole 407b and the interconnect trenches 407c are removed by CMP, thereby forming a via 409 and second interconnections 410.

Figure 10:
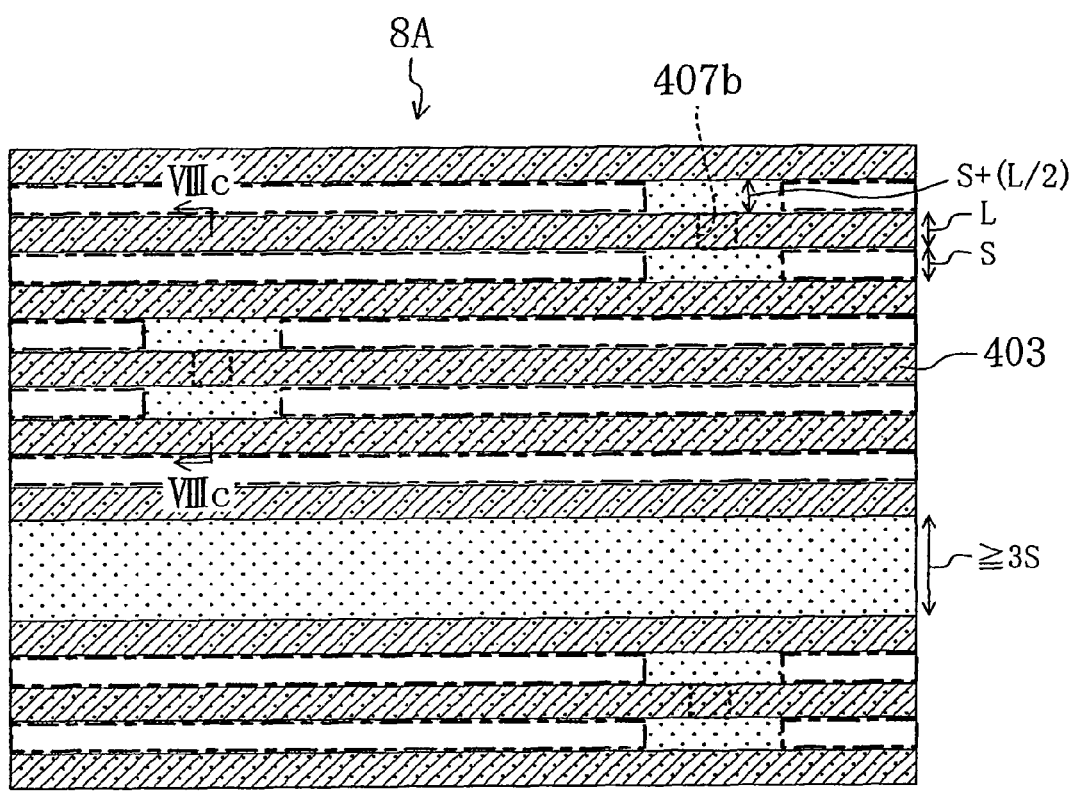
FIG. 10 is a plan view illustrating a mask layout of a resist pattern according to the fourth embodiment.
Figure 11A:
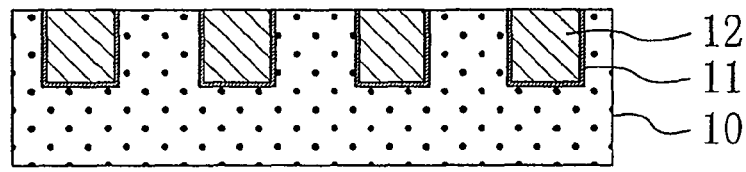
FIGS. 11A through 11D are cross-sectional views of main portions showing a method for forming air gaps in a copper interconnect structure according to a conventional example.
Figure 11B:
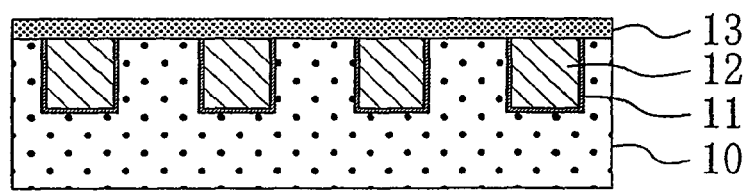
Figure 11C:
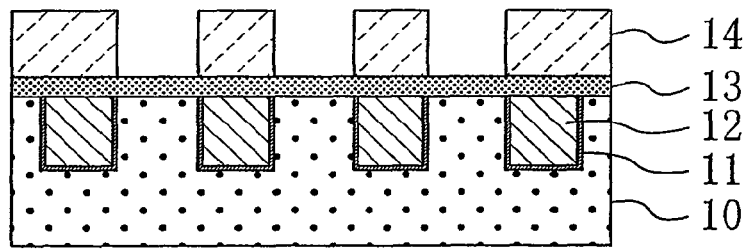
Figure 11D:
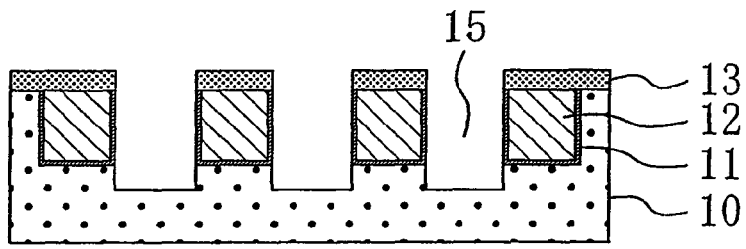
Figure 12A:
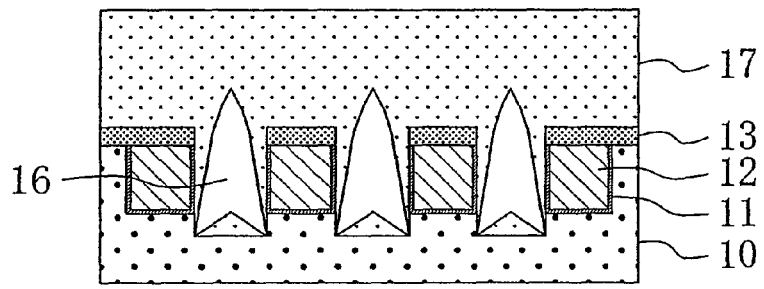
FIGS. 12A through 12C are cross-sectional views of main portions showing the method for forming air gaps in a copper interconnect structure according to the conventional example.
Figure 12B:
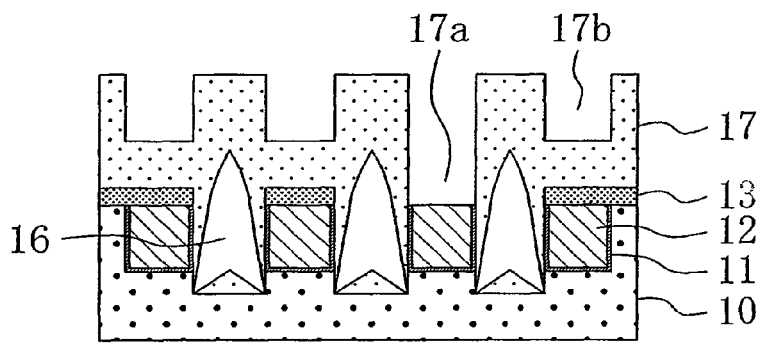
Figure 12C:
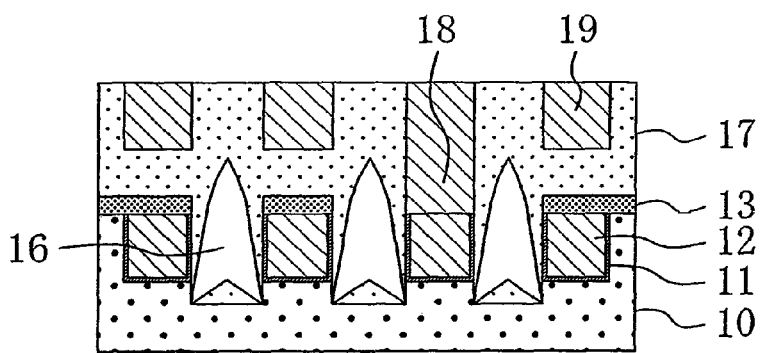
Figure 13A:
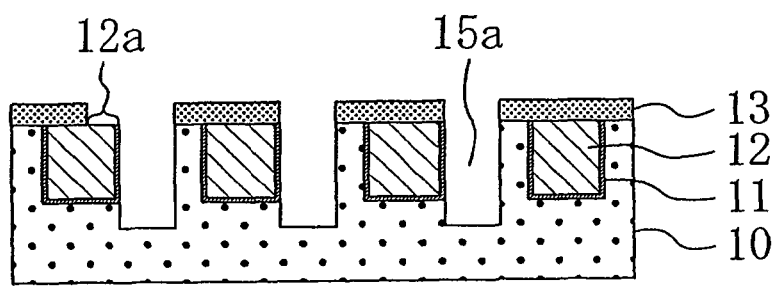
FIGS. 13A and 13B are cross-sectional views of main portions showing a copper interconnect structure including air gaps at the occurrence of misalignment, which is a problem to be solved by the present invention.
Figure 13B:
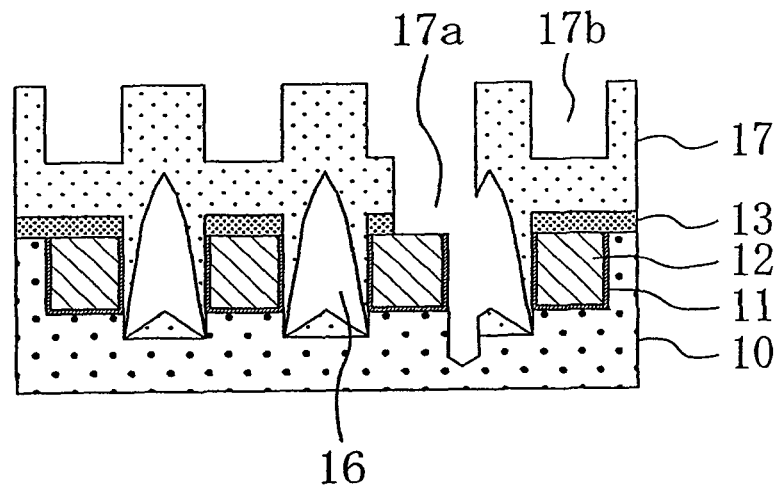
Figure 14:
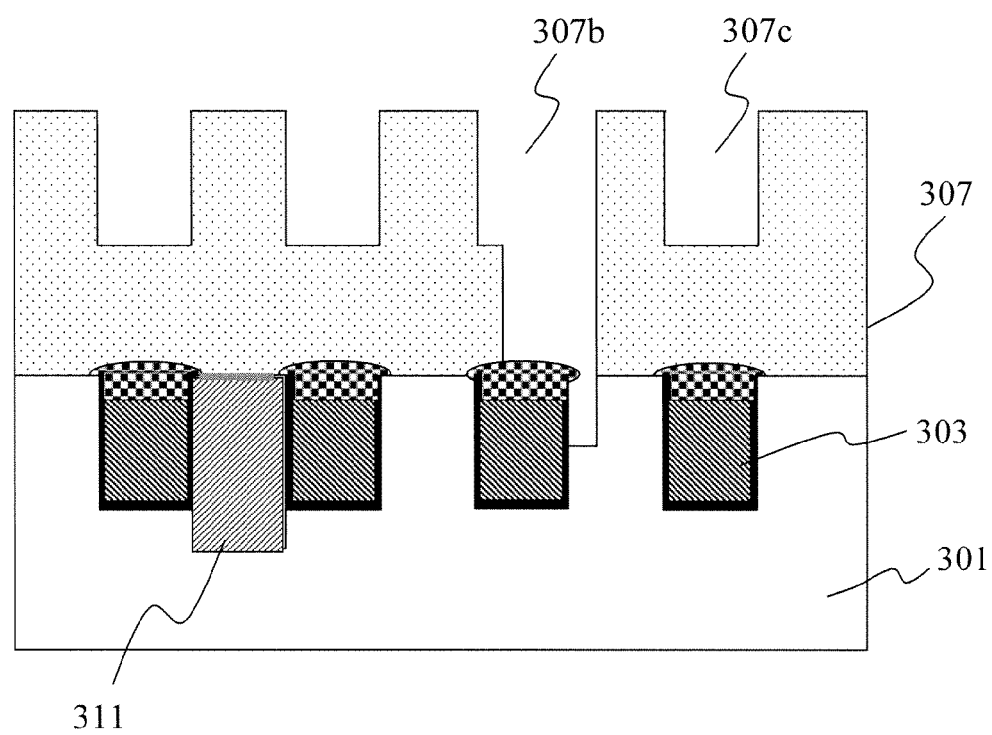
FIG. 14 is an exemplary cross-sectional view of an intermediate step of the method for fabricating a semiconductor device according to the present disclosure.

Now, a mask layout 8A for forming the resist pattern for use in the process step shown in FIG. 8C will be specifically described with reference to FIG. 10. FIG. 10 is a schematic plan view for describing an example of a mask layout of a resist pattern 412 for use in the process step shown in FIG. 8C. FIG. 8C corresponds to a cross-sectional view taken along the line VIIIc-VIIIc shown in FIG. 10.

In FIG. 10, the interconnection width (minimum interconnection width) of the first to interconnections 403 formed at the minimum resolution of lithography is represented as L and the distance between the first interconnections 403 (minimum interconnection-to-interconnection space) formed at the minimum resolution of lithography is represented as S. In FIG. 10, the positions of the connecting holes 407b formed in a subsequent process step (see, FIG. 9D) are also shown.

As illustrated in FIG. 10, the mask layout 8A of the resist pattern 412 includes: a mask region 8a (provided with dots) covering, with a resist, regions over the connecting holes 407b and regions over the first interconnections 403; and an opening region 8b (provided with no dots) for exposing the regions between the first interconnections 403 except for the mask region 8a.

The mask layout 8A is formed by automatic design in which a region having an interconnection-to-interconnection space wider than or equal to S and narrower than 3S is automatically detected and an opening region is formed in the detected region. With respect to the regions for the connecting holes 407b, a mask region is formed so as to mask portions each expanded by S+(L/2) from an associated one of the regions where the connecting holes 407b are to be formed, and then this mask region is subtracted from the previously-formed opening region. In this manner, the mask layout 8A including the mask region 8a and the opening region 8b for forming the resist pattern shown in FIG. 8C is designed.

The use of the mask layout 8A designed as described above allows formation of a resist pattern with which an air gap 408 is formed in an interconnection-to-interconnection space wider than or equal to S and narrower than 3S and no air gap 408 is formed at both sides of the first interconnection 403 connected to the second interconnection 410 through the via

409. The reason for detecting the opening region in the range wider than or equal to S and narrower than 3S and the reason for masking portions expanded from the formation regions of the connecting holes 407*b* by S+(L/2) are the same as those described in the first embodiment.

What is claimed is:

1. A method for fabricating a semiconductor device, the method comprising steps of:
   forming a plurality of lower interconnections including a first lower interconnection and a second lower interconnection adjacent to the first lower interconnection, at intervals in a first insulating film;
   removing a portion of the first insulating film located between the lower interconnections, thereby forming an interconnection-to-interconnection gap;
   burying a low-dielectric-constant film in the interconnection-to-interconnection gap;
   forming a second insulating film over the first insulating film in which the lower interconnections and the low-dielectric-constant film are buried; and
   forming, in the second insulating film, a connection portion connected to the first lower interconnection, and an upper interconnection connected to the connection portion, wherein:
   in the forming of the interconnection-to-interconnection gap, no first insulating film is removed in a space between the first lower interconnection and the second lower interconnection, in a cross sectional view, along a direction perpendicular to the first and second lower interconnections, including the first lower interconnection, the second lower interconnection and the connection portion.

2. The method of claim 1, wherein
   the surfaces of the lower interconnections are lower than the surface of the first insulating film.

3. The method of claim 1, wherein
   an interconnection-to-interconnection space X between the lower interconnections sandwiching the low-dielectric-constant film satisfies the following relationship:

$$S = X$$

where S is a minimum interconnection-to-interconnection space between the lower interconnections formed at a minimum resolution of lithography.

4. The method of claim 1, wherein the low-dielectric-constant film is located, from the connection portion, at least at a distance y satisfying the following relationship:

$$y = S + (L/2)$$

where S is a minimum interconnection-to-interconnection space between the lower interconnections formed at a minimum resolution of lithography and L is a minimum interconnection width of the lower interconnections formed at the minimum resolution of lithography.

5. The method of claim 1, wherein
   the interconnection-to-interconnection gap is formed using a resist pattern as a mask, and
   the resist pattern has an opening pattern for exposing a region which is located between the lower interconnections and in which the interconnection-to-interconnection gap is to be formed and a region expanded from that region toward the lower interconnections sandwiching the region by a distance z satisfying the following relationship:

$$z = L/2$$

where L is the minimum interconnection width of the lower interconnections formed at the minimum resolution of lithography.

6. The method of claim 1, wherein
   the method further comprises the step of selectively forming a cap layer on each of the surfaces of the lower interconnections, after the step of forming the lower interconnections and before the step of forming the interconnection-to-interconnection gap.

7. A method for fabricating a semiconductor device, the method comprising the steps of:
   forming a plurality of lower interconnections at intervals in a first insulating film;
   removing a portion of the first insulating film located between the lower interconnections, thereby forming an interconnection-to-interconnection gap;
   burying a low-dielectric-constant film in the interconnection-to-interconnection gap;
   forming a second insulating film over the first insulating film in which the lower interconnections and the low-dielectric-constant film are buried;
   forming, in the second insulating film, a connection portion connected to one of the lower interconnections and an upper interconnection connected to the connection portion; and
   selectively forming a cap layer on each of the surfaces of the lower interconnections, after the step of forming the lower interconnections and before the step of forming the interconnection-to-interconnection gap
   wherein the connection portion is formed to be connected to one of the lower interconnections not adjacent to the low-dielectric-constant film.

8. A method for fabricating a semiconductor device, the method comprising steps of:
   forming a first insulating film on a semiconductor substrate;
   forming recesses on a surface of the first insulating film from an upper surface of the first insulating film, the recesses constituting interconnect trenches adjoining each other with a space therebetween;
   forming a plurality of lower interconnections including a first lower interconnection and a second lower interconnection adjacent to each other, at intervals by forming a conductive film in the interconnect trenches;
   removing a portion of the first insulating film located between the lower interconnections, thereby forming an interconnection-to-interconnection gap
   burying a low-dielectric-constant film in the interconnection-to-interconnection gap;
   forming a second insulating film over the first insulating film in which the lower interconnections and the low-dielectric-constant film are buried; and
   forming, in the second insulating film, a connection portion connected to the first lower interconnection, and an upper interconnection connected to the connection portion,
   wherein the low-dielectric-constant film is not formed in a space between the first lower interconnection and the second lower interconnection, in a cross sectional view, along a direction perpendicular to the first and second lower interconnections, including the first lower interconnection, the second lower interconnection and the connection portion.

9. The method of claim 8, wherein
   the method further comprises the step of selectively forming a cap layer on each of the surfaces of the lower interconnections, after the step of forming the lower interconnections and before the step of forming the interconnection-to-interconnection gap.

10. The method of claim 8, wherein
the surfaces of the lower interconnections are lower than the surface of the first insulating film.

11. The method of claim 8, wherein
an interconnection-to-interconnection space X between the lower interconnections sandwiching the low-dielectric-constant film satisfies the following relationship:

$$S=X$$

where S is a minimum interconnection-to-interconnection space between the lower interconnections formed at a minimum resolution of lithography.

12. The method of claim 8, wherein the low-dielectric-constant film is located, from the connection portion, at least at a distance y satisfying the following relationship:

$$y=S+(L/2)$$

where S is a minimum interconnection-to-interconnection space between the lower interconnections formed at a minimum resolution of lithography and L is a minimum interconnection width of the lower interconnections formed at the minimum resolution of lithography.

13. The method of claim 8, wherein
the interconnection-to-interconnection gap is formed using a resist pattern as a mask, and
the resist pattern has an opening pattern for exposing a region which is located between the lower interconnections and in which the interconnection-to-interconnection gap is to be formed and a region expanded from that region toward the lower interconnections sandwiching the region by a distance z satisfying the following relationship:

$$z=L/2$$

where L is the minimum interconnection width of the lower interconnections formed at the minimum resolution of lithography.

* * * * *